United States Patent
Shida et al.

(10) Patent No.: US 6,830,989 B1
(45) Date of Patent: Dec. 14, 2004

(54) METHOD AND APPARATUS FOR HANDLING ARRAYED PART

(75) Inventors: Satoshi Shida, Hirakata (JP); Shinji Kanayama, Kashihara (JP); Takashi Shimizu, Kishiwada (JP); Kenji Takahashi, Suita (JP); Ryoji Inutsuka, Osaka (JP); Hiroyuki Yoshida, Kadoma (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 148 days.

(21) Appl. No.: 10/069,401

(22) PCT Filed: Aug. 24, 2000

(86) PCT No.: PCT/JP00/05672

§ 371 (c)(1),
(2), (4) Date: Feb. 26, 2002

(87) PCT Pub. No.: WO01/17005

PCT Pub. Date: Mar. 8, 2001

(30) Foreign Application Priority Data

Aug. 27, 1999 (JP) ............................................ 11-241410
Oct. 27, 1999 (JP) ............................................ 11-305342

(51) Int. Cl.[7] ...................... H01L 21/301; H01L 21/46; H01L 21/78
(52) U.S. Cl. ...................... 438/460; 438/462; 438/464
(58) Field of Search ................................ 438/460–465

(56) References Cited

U.S. PATENT DOCUMENTS

| | | | | |
|---|---|---|---|---|
| 5,362,681 A | * | 11/1994 | Roberts et al. | ............. 438/464 |
| 6,171,933 B1 | * | 1/2001 | Xu et al. | .................... 438/462 |
| 6,461,938 B2 | * | 10/2002 | Nakabayashi | ............... 438/458 |
| 6,482,677 B2 | * | 11/2002 | Sato et al. | ................... 438/109 |
| 2003/0060021 A1 | * | 3/2003 | Kurosawa et al. | .......... 438/455 |

FOREIGN PATENT DOCUMENTS

| | | |
|---|---|---|
| JP | 45-29862 | 9/1970 |
| JP | 60-161630 | 8/1985 |
| JP | 4-63442 | 2/1992 |
| JP | 7-221164 | 8/1995 |
| JP | 9-283983 | 10/1997 |
| JP | 10-270532 | 10/1998 |
| JP | 11-8259 | 1/1999 |

OTHER PUBLICATIONS

Microfilm of the specification and drawings annexed to the request of Japanese Utility Model Application No. 137692/1986 (Laid–open No. 42506/1988) (NEC Corporation), Mar. 22, 1988.

* cited by examiner

*Primary Examiner*—John F. Niebling
*Assistant Examiner*—Angel Roman
(74) *Attorney, Agent, or Firm*—Wenderoth, Lind & Ponack, L.L.P.

(57) ABSTRACT

Handling of each arrayed component is implemented in pickup operation within a movement range of a supporting body against the size of a supporting region of the arrayed component smaller than that in the prior art. Each component supported on a supporting body in array is moved to a pickup position with a movement of the supporting body in X and Y two component array directions, and is fed to pickup operation by a tool with push-up operation by a push-up pin involved, in which after each unit region (D1 to D4) dividedly set around the pickup position of the supporting body is positioned at a pickup standby position by rotation of the supporting body in a switching manner, the component in the positioned unit region is moved in each component array direction of the supporting body and fed to pickup operation in sequence.

8 Claims, 21 Drawing Sheets

METHOD AND APPARATUS FOR HANDLING ARRAYED PART

TECHNICAL FIELD

The present invention relates to a method and apparatus for handling arrayed components that feeds arrayed components composed of a plurality of components in array, and more particularly, relates to a method and apparatus for handling arrayed components including a feeding method and device of arrayed components, a transfer device with use of the feeding device, and a housing device. More specifically, the present invention relates to, for example, a method and device for feeding arrayed semiconductor elements so that a number of diced semiconductor elements arrayed in vertical and horizontal direction are picked up one by one, a transfer device for transferring picked-up semiconductor elements to other places, and a housing device for housing the picked-up semiconductor elements in various housing members in specified packing styles. One example of the semiconductor elements includes an individual IC chip separated by dicing from a semiconductor wafer with a plurality of integrated circuits formed.

BACKGROUND ART

A semiconductor wafer is fabricated to have a number of semiconductor elements arrayed in vertical and horizontal direction. Each semiconductor element is subjected to processings such as checking of defective products and marking thereof, and then separated by dicing processing for enabling individual handling. Each semiconductor element is arrayed orderly and densely on a dicing sheet. In order to ensure swift pickup of each of the semiconductor elements one by one for enabling various handling such as transfer to other places or housing, in the past as shown in FIG. 18, the semiconductor elements have been collectively handled by a supporting body 106 supporting the semiconductor elements with held on the dicing sheet. With a movement of the supporting body 106 at a specified position in X and Y two orthogonal array directions of each semiconductor element, the semiconductor elements are sequentially moved to a pickup position where a push-up pin is provided to aid pickup operation by pushing the semiconductor element up from the lower side, and after semiconductor elements are separated from each other through expanding of the dicing sheet and pushed up from the lower side by the push-up pin, the semiconductor elements are subjected to pickup operation by a component handling tool 103.

Consequently, in pickup operation, one semiconductor element at the pickup position is in the state separated from other semiconductor elements and pushed up higher than other surrounding semiconductor elements, which enables the component handling tool 103 to sufficiently execute pickup operation such as suction targeting the sole semiconductor element without being bothered by surrounding semiconductor elements or causing displacement of surrounding semiconductor elements, thereby achieving swift and secure pickup of the semiconductor element.

The sizes of semiconductor wafers are becoming larger for further increase of efficiency in manufacturing and handling of semiconductor elements. Large wafer has a diameter as large as about 200 mm. In the future, there is expected a wafer having a diameter as large as about 300 mm. However, in manufacturing of semiconductor elements, since all individual diced semiconductor elements put on the supporting body 106 are handled with pickup operation in the above-stated method, a travel distance necessary for the supporting body 106 to bring all individual semiconductor elements to the position of the push-up pin provided in a specified position, i.e., the pickup position, corresponds to a diameter of a semiconductor wafer both in two X and Y directions, i.e., the size of a region that the supporting body 106 supports the semiconductor elements, the necessary plane space of which is twice the diameter of the semiconductor wafer both in X and Y directions as shown in FIG. 18. As a result, an apparatus for handling semiconductor wafers having a large diameter and picking up diced semiconductor elements as shown above has larger plane space by necessity.

Larger-sized apparatuses cause not only increased cost of the apparatuses themselves, but also causes higher running cost in heating and electricity of a clean room in which the apparatuses are used, which, in one example, equals as high as 30 million yen a month in the case of a clean room with area of 600 m$^2$, bringing about a serious new issue of increased occupied area of the apparatus.

It is an object of the present invention to provide a method and device for feeding arrayed components and a method and apparatus for handling arrayed components using the method and device for feeding arrayed components capable of handling all the arrayed components in pickup operation within a movement range of a supporting body against the size of a region for supporting arrayed components subject to pickup operation such as diced semiconductor elements smaller than that in the prior art.

DISCLOSURE OF INVENTION

In order to achieve the above object, the present invention is structured as described below.

According to a first aspect of the present invention, there is provided a method for handling arrayed components that feeds the arrayed components arrayed in two component array directions, comprising: moving each component supported on a supporting body in a state of being arrayed in two orthogonal directions to a pickup position in sequence with a movement of the supporting body in the two component array directions, and making the components subjected to pickup operation by a component handling tool, wherein each unit region set by dividing a component supporting region of the supporting body about an approximately central position of the supporting body into a plurality of regions is positioned at a pickup standby position by rotation of the supporting body about the approximately central position of the supporting body in a switching manner; and after each unit region is positioned at the pickup standby position, positioning each component in the positioned unit region to the pickup position in sequence with a movement of the supporting body in the two component array directions, and subjected to pickup operation in sequence.

According to a second aspect of the present invention, there is provided a method for handling arrayed components that feeds the arrayed components arrayed in two component array directions as defined in Claim 1, wherein the component is subjected to the pickup operation by the component handling tool with push-up operation by a push-up pin involved, and after each unit region is positioned at the pickup standby position, the component in the positioned unit region is moved to the pickup position in sequence with a relative movement of the supporting body, the pickup position, and the push-up pin in the two component array directions, and subjected to the pickup operation in sequence to feed the arrayed components arrayed in the two component array directions.

According to a third aspect of the present invention, there is provided a method for handling arrayed components that feeds the arrayed components arrayed in two component array directions as defined in Claim 1, wherein the component is subjected to the pickup operation by the component handling tool with push-up operation by a push-up pin involved, and when the component is subjected to the pick-up operation, further comprising corresponding each unit region set by dividing a component supporting region of the supporting body about an approximately central position of the supporting body into a plurality of regions to the pickup position and the push-up pin, and after the pickup position and the push-up pin are corresponded to each unit region, moving components in the unit region corresponding to the pickup position and the push-up pin in sequence to the pickup position with a relative movement of the pickup position and the push-up pin, and the supporting body in the two component array directions, and making the components subjected to pickup operation in sequence to feed the arrayed components arrayed in the two component array directions.

According to a fourth aspect of the present invention, there is provided a method for handling arrayed components as defined in any one of the first to third aspects, wherein the unit region is a quarter region divided by an angle of 90 degrees.

According to a fifth aspect of the present invention, there is provided an apparatus for handling arrayed components, comprising:

a component receiving section for receiving and holding a supporting body which supports components arrayed in two orthogonal directions;

a receiving section rotating device for rotating the component receiving section about an approximately central position of the received supporting body, and for positioning each unit region of a plurality of regions set by dividing a component supporting region of the supporting body about the approximately central position of the supporting body into the regions at a pickup standby position about the approximately central position of the supporting body in a switching manner; and a two-direction moving device that moves the component receiving section in the two component array directions and moves the components in a unit region positioned at the pickup standby position on the supporting body to the pickup position in sequence for making the components, subjected to pickup operation by a component handling tool.

According to a sixth aspect of the present invention, there is provided an apparatus for handling arrayed components as defined in the fifth aspect, further comprising a component transfer device for picking up the component moved to the pickup position with use of the component handling tool and transferring the same to other places.

According to a seventh aspect of the present invention, there is provided an apparatus for handling arrayed components as defined in the fifth or sixth aspect, further comprising:

a component housing section which makes it possible to handle the component in a packing style as being received in a component housing member for next-step handling; and a component transfer device for picking up the component positioned at the pickup position with use of the component handling tool and transferring the same to the component housing member in the component housing section.

According to an eighth aspect of the present invention, there is provided an apparatus for handling arrayed components as defined in any one of the fifth to seventh aspects, further comprising:

an identifying device for imaging the component at the pickup position and performing image recognition;

a reference position switching device for switching reference of position recognition by the identifying device after a unit region at the pickup standby position is switched with rotation of the supporting body by the receiving section rotating device.

According to a ninth aspect of the present invention, there is provided an apparatus for handling arrayed components as defined in the seventh or eighth aspect, comprising:

a tool rotating device for rotating the component handling tool about a center of the component to be picked up thereby; and a control unit for controlling the tool rotating device so as to correct a direction of the component picked up by the component handling tool through rotation of the component handling tool by the tool rotating device after a unit region located at the pickup standby position is switched with rotation of the supporting body by the receiving section rotating device.

According to a 10th aspect of the present invention, there is provided an apparatus for housing arrayed components as defined in the eighth aspect, comprising a control unit for controlling operation of the component housing section and the component handling tool so that the component housing section can provide a plurality of component housing members side by side, and a plurality of the component housing members are separately used properly depending on a type of the component picked up by the component handling tool and identified by the identifying device for transfer and housing operation.

According to an 11th aspect of the present invention, there is provided an apparatus for handling arrayed components as defined in the tenth aspect, wherein the type of the component is quality rank defined by electric characteristics and frequency characteristics of each component.

According to a 12th aspect of the present invention, there is provided an apparatus for handling arrayed components as defined in the 11th aspect, wherein one of the types of the components is a defective product, and the control unit controls operation of the component handling tool so that the component handling tool disposes a component identified by the identifying device as a defective product in a disposal section.

According to a 13th aspect of the present invention, there is provided an apparatus for handling arrayed components as defined in any one of the seventh to 12th aspects, wherein the component housing member is a tape member.

According to a 14th aspect of the present invention, there is provided an apparatus for handling arrayed components as defined in any one of the fifth to 13th aspects, wherein the unit region is a quarter region divided at an angle of 90 degrees.

According to a 15th aspect of the present invention, there is provided an apparatus for handling arrayed components as defined in any one of the fifth to 13th aspects, wherein the unit region is a half region divided at an angle of 180 degree.

According to a 16th aspect of the present invention, there is provided a method for handling arrayed components that transfers the arrayed components arrayed in two component array directions, comprising:

feeding a supporting body that supports a plurality of components in a state of being arrayed in the two orthogonal directions to a component feeding position;

moving each component in sequence to a pickup position with a movement of the supporting body at the component feeding position in the two component array directions;

picking up the component moved to the pickup position with use of the component handling tool; and transferring the picked-up component to a component transfer target position set to be laid over a top of the supporting body with use of the component handling tool.

According to a 17th aspect of the present invention, there is provided a method for handling arrayed components as defined in the first aspect that transfers the arrayed components arrayed in the two component array direction, comprising:

picking up the component moved to the pickup position with use of the component handling tool; and transferring the picked-up component to a component transfer target position set to be laid over a top of the supporting body with use of the component handling tool.

According to an 18th aspect of the present invention, there is provided a method for handling arrayed components as defined in the first or 17th aspects, wherein the component picked up with use of the component handling tool is transferred with front side and back side of the component inverted.

According to a 19th aspect of the present invention, there is provided an apparatus for handling arrayed components, comprising:

a component receiving section for receiving and holding a supporting body that supports a plurality of components in a state of being arrayed in two orthogonal directions;

a two-direction moving device that moves the component receiving section in the two component array directions for moving the components to the pickup position in sequence;

a component housing section disposed at a position to be laid over a top of the component receiving section; and a component transfer device for picking up the component and transferring the same to the component housing section whenever the component is moved to the pickup position According to a 20th aspect of the present invention, there is provided an apparatus for handling arrayed components as defined in the 19th aspect, wherein the component housing section is disposed in a plurality of rows at a position to be laid over the top of the component receiving section, and the component transfer device picks up the component and transfers the same to each component housing section whenever the component is moved to the pickup position.

According to a 21st aspect of the present invention, there is provided an apparatus for handling arrayed components as defined in the sixth aspect, further comprising a component housing section disposed at a position to be laid over a top of the component receiving section, wherein the component transfer device picks up the component and transfers the same to the component housing section whenever the component is moved to the pickup position.

According to a 22nd aspect of the present invention, there is provided an apparatus for handling arrayed components as defined in the 21st aspect, wherein the component housing section is disposed in a plurality of rows at a position to be laid over the top of the component receiving section, and the component transfer device picks up the component and transfers the same to each component housing section whenever the component is moved to the pickup position.

According to a 23rd aspect of the present invention, there is provided an apparatus for handling arrayed components as defined in any one of the 19th to 22nd aspects, further comprising a front-back inverting device disposed between the transfer device and the component housing section, for selectively performing operation of receiving the component from the transfer device, inverting front side and back side of the component, and housing the component in the component housing section.

According to a 24th aspect of the present invention, there is provided an apparatus for handling arrayed components as defined in the 20th or 22nd aspect, further comprising a second component transfer device for receiving the component from the transfer device and separately transferring the component to the component housing section provided in a plurality of rows.

According to a 25th aspect of the present invention, there is provided an apparatus for handling arrayed components as defined in the 20th or 22nd aspect, further comprising a front-back inverting device for receiving the component from the component transfer device, moving to the component housing section provided in a plurality of rows, and separately transferring the component with front side and back side thereof inverted to each component housing section.

According to a 26th aspect of the present invention, there is provided an apparatus for handling arrayed components as defined in the 20th or 22nd aspect, wherein a concave section of each component housing section disposed in a plurality of the rows is moved to a transfer target position on the component receiving section, and the component is transferred to the concave section of the component housing section moved to the transfer target position by the component transfer device.

According to a 27th aspect of the present invention, there is provided an apparatus for handling arrayed components as defined in the 20th or 22nd aspect, wherein based on data identifying respective division of each component arrayed on the supporting body, each component of respective division is transferred to a plurality of the component housing sections disposed by division of each component.

According to a 28th aspect of the present invention, there is provided an apparatus for handling arrayed components as defined in the sixth aspect, the components being a plurality of semiconductor elements separated from a semiconductor wafer by dicing, further comprising:

a component feeding section for housing a supporting body that supports the component in a state of being arrayed in the two orthogonal directions and feeding the same to a feeding position;

a taping packaging section for housing the semiconductor elements in array in an extending direction of the tape member and performing taping packaging; and a front-back inverting device disposed between the component transfer device and the taping packaging section, for selectively performing operation of receiving the semiconductor element from the component transfer device, inverting front side and back side of the semiconductor element, and housing the component in the taping packaging section, wherein the component receiving section receives and holds the supporting body extracted from the component feeding section, the two-direction moving device moves the component receiving section in the two component array directions for moving the semiconductor element in sequence to a pickup position, and the component transfer device picks up the semiconductor element and transfers the same in sequence to the taping packaging section whenever the semiconductor element is moved to the pickup position.

According to a 29th aspect of the present invention, there is provided an apparatus for handling arrayed components as defined in the 28th aspect, wherein the taping packaging section is disposed at a position to be laid over a top of the component receiving section.

According to a 30th aspect of the present invention, there is provided an apparatus for handling arrayed components as defined in the 28th or 29th aspect, wherein based on data identifying each semiconductor element disposed in array on the semiconductor wafer by quality rank defined by electric characteristics and frequency characteristics of each semiconductor element, each semiconductor element of respective quality rank is transferred to a plurality of taping packaging sections disposed by quality rank.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE PRESENT INVENTION

Figure 1:
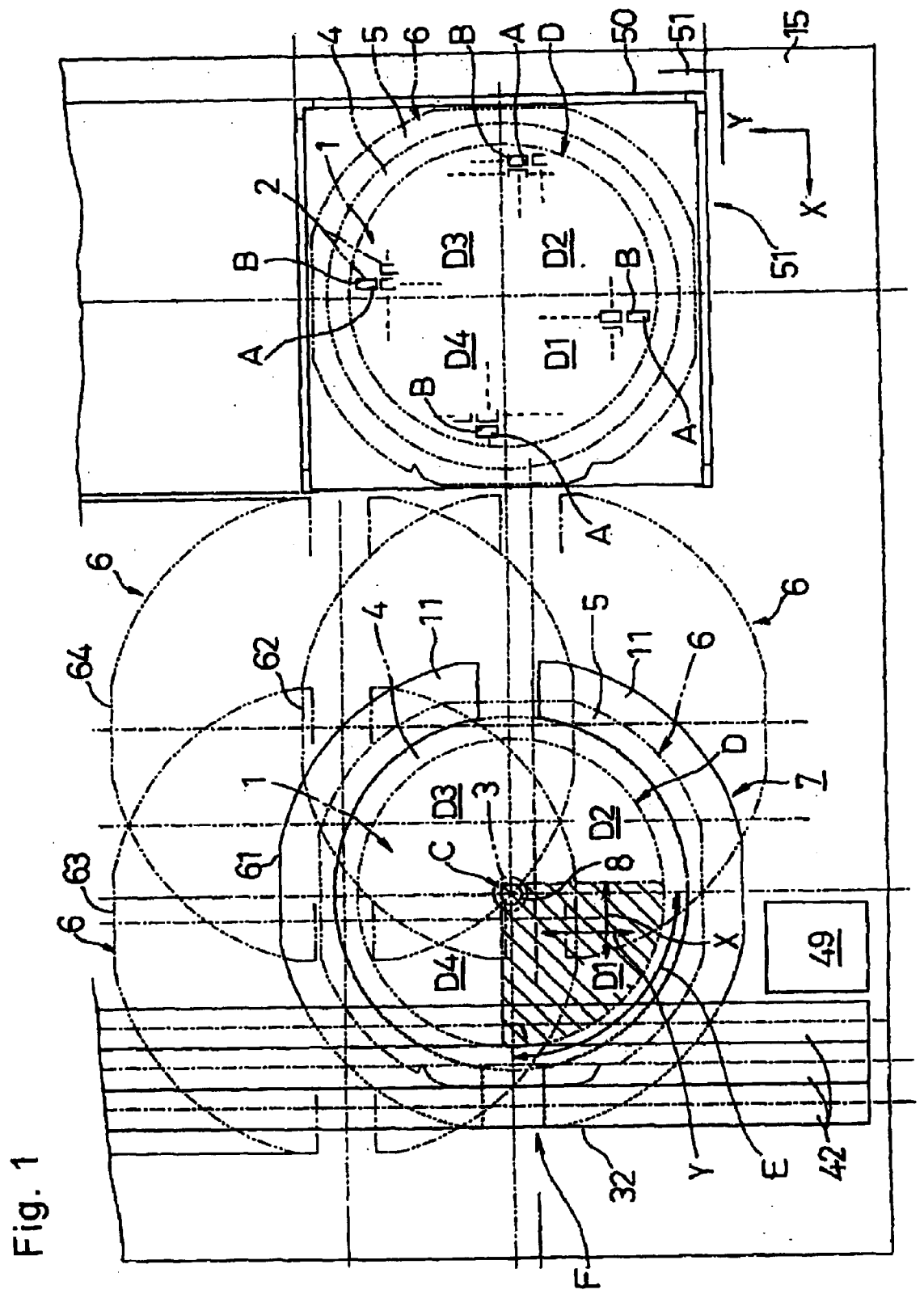
FIG. 1 is a plan view showing an apparatus for feeding, transferring, and housing arrayed components according to a first embodiment of the present invention.

Before the description of the present invention proceeds, it is to be noted that like parts are designated by like reference numerals throughout the accompanying drawings.
(First Embodiment)

Figure 19:
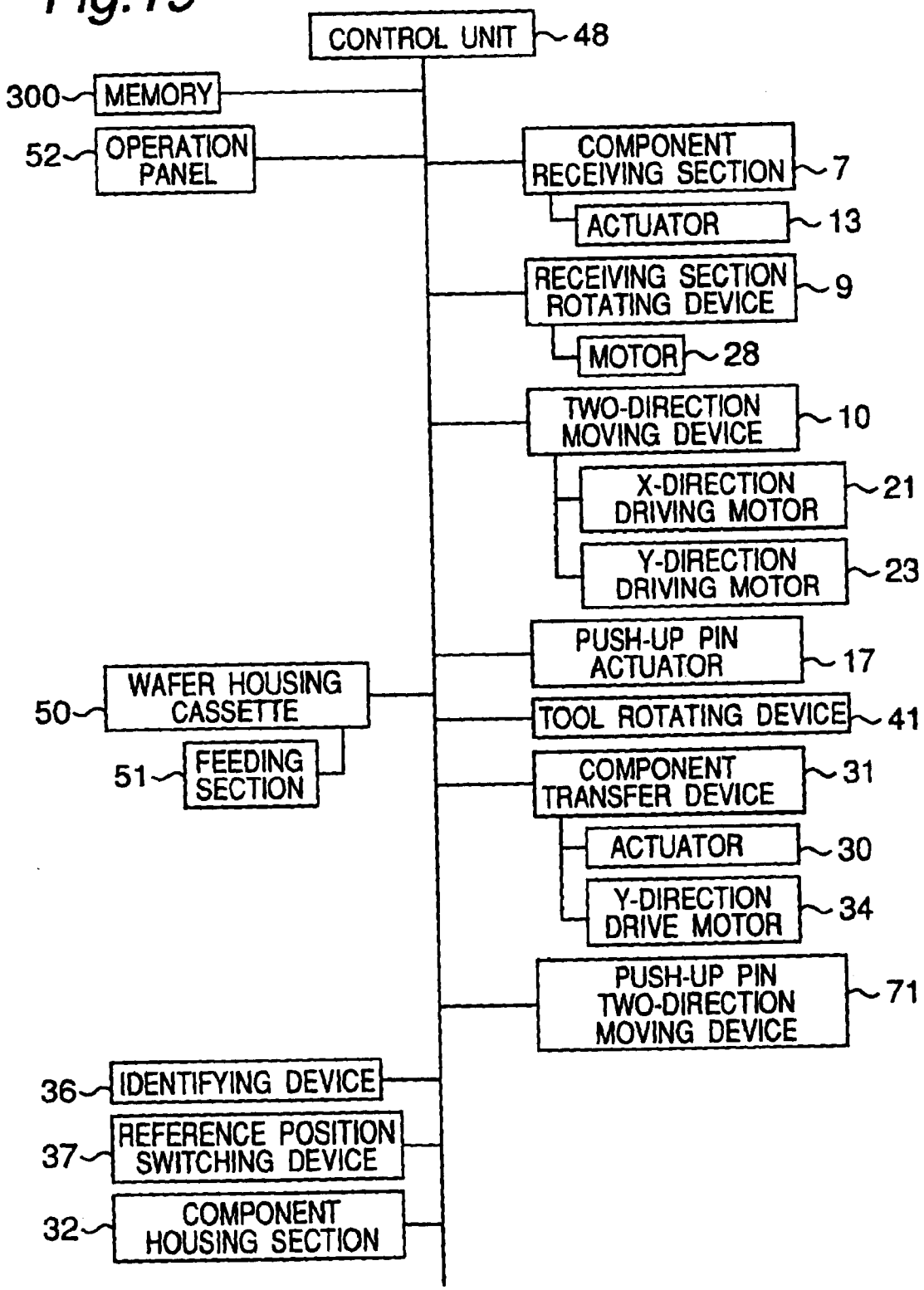
FIG. 19 is a block diagram showing a relation between a control unit and other devices in the apparatus for handling arrayed components in the first and second embodiments of the present invention.

The following description discusses a method and apparatus for handling arrayed components according to the first embodiment of the present embodiment, and more specifically, a feeding method and device of arrayed components, a transfer device of arrayed components with use of the feeding device, and a housing device of arrayed components, with reference to FIGS. 1 to 8, FIG. 16, FIG. 17, and FIG. 19 for understanding of the present invention. It is noted that each operation of the apparatus for handling arrayed components in the first embodiment is controlled by a control unit 48 as shown in FIG. 19.

Figure 3:
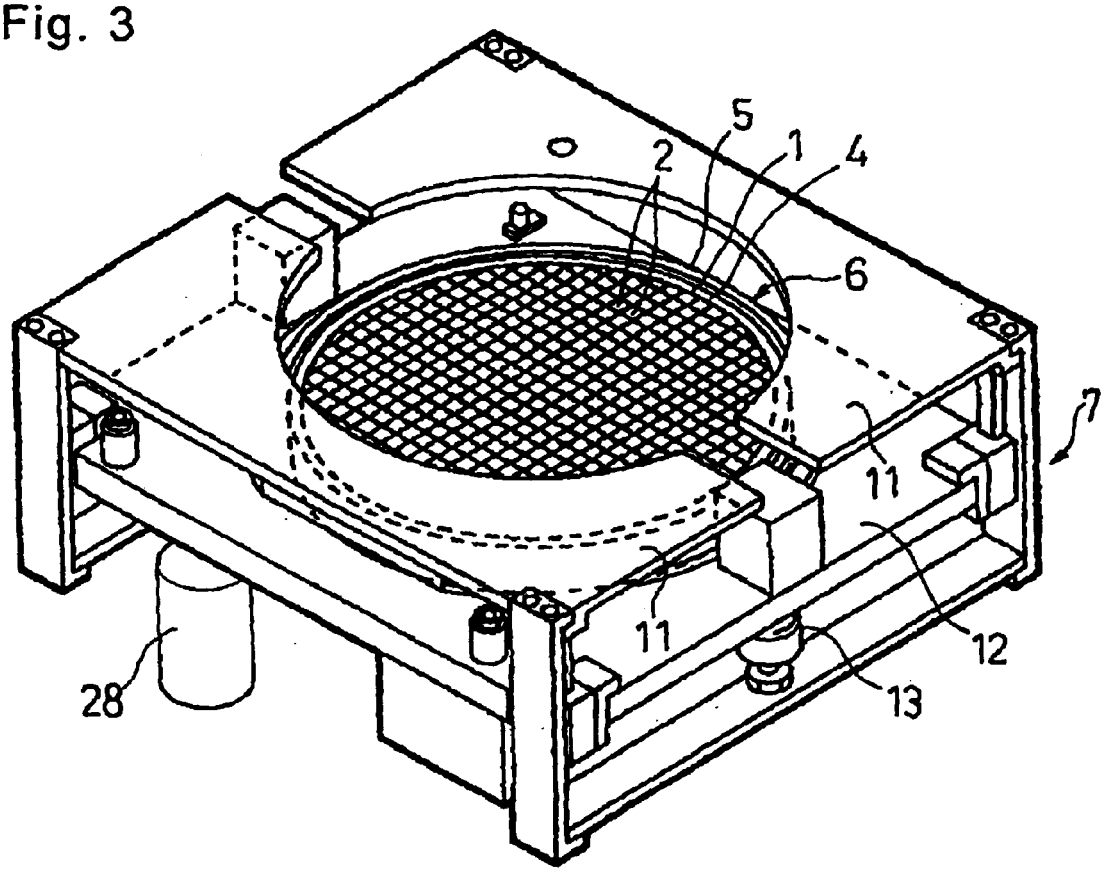
FIG. 3 is a perspective view showing a component receiving section in the apparatus of FIG. 1.

The first embodiment exemplifies the case where a semiconductor wafer 1 as mainly shown in FIGS. 1 and 3 is diced on a dicing sheet 4 into individual pieces, and a semiconductor element 2 in a state of being arrayed in two orthogonal directions is treated as one example of an arrayed component, which is picked up one by one by a component handling tool that holds or releases components such as a suction nozzle 3 and is transferred to other places. However, the present invention is not limited to this embodiment, and a component handling tool with other holding methods such as chucks is also applicable depending on the types of components to be handled.

The dicing sheet 4 has non-oriented elasticity, and is supported in an extended state by a ring-shaped supporting metal fitting 5. The dicing sheet 4 exemplifies a supporting body 6 that enables stable handling and feeding of a semiconductor element 2 as a diced arrayed component obtained after dicing of the semiconductor wafer 1. When handling components other than the semiconductor element 2 (ex., substrate), the supporting body 6 suitable for the type of the component may be employed.

In a method for feeding arrayed components according to the first embodiment, basically, each semiconductor element 2 supported on the supporting body 6 in a state of being arrayed in the two orthogonal directions is moved in sequence to a specified pickup position C with a movement of the supporting body 6 at a specified position on a base 15, ex., a component feeding position, in X and Y directions along the two component array directions, and is subjected to pickup operation by the suction nozzle 3 with push-up operation from lower side by a push-up pin 8. More specifically, each unit region D1, D2, . . . set by dividing a component supporting region D of the supporting body 6 about a central position of the supporting body 6, or, for example, about the pickup position C, into a plurality of regions is switched to be positioned at a pickup standby position shown as a slanted area in FIG. 1, i.e., a pickup standby position E, by rotation of the supporting body 6 about the pickup position C, and after each unit region D1, D2, . . . is positioned at the pickup standby position E, each semiconductor element 2 positioned in the unit region D1, D2, . . . , or within the range of a region shown as a slanted area in FIG. 1 for example, is fed in sequence to pickup operation by the suction nozzle 3 with a movement of the supporting body 6 in the X and Y direction.

Figure 18:
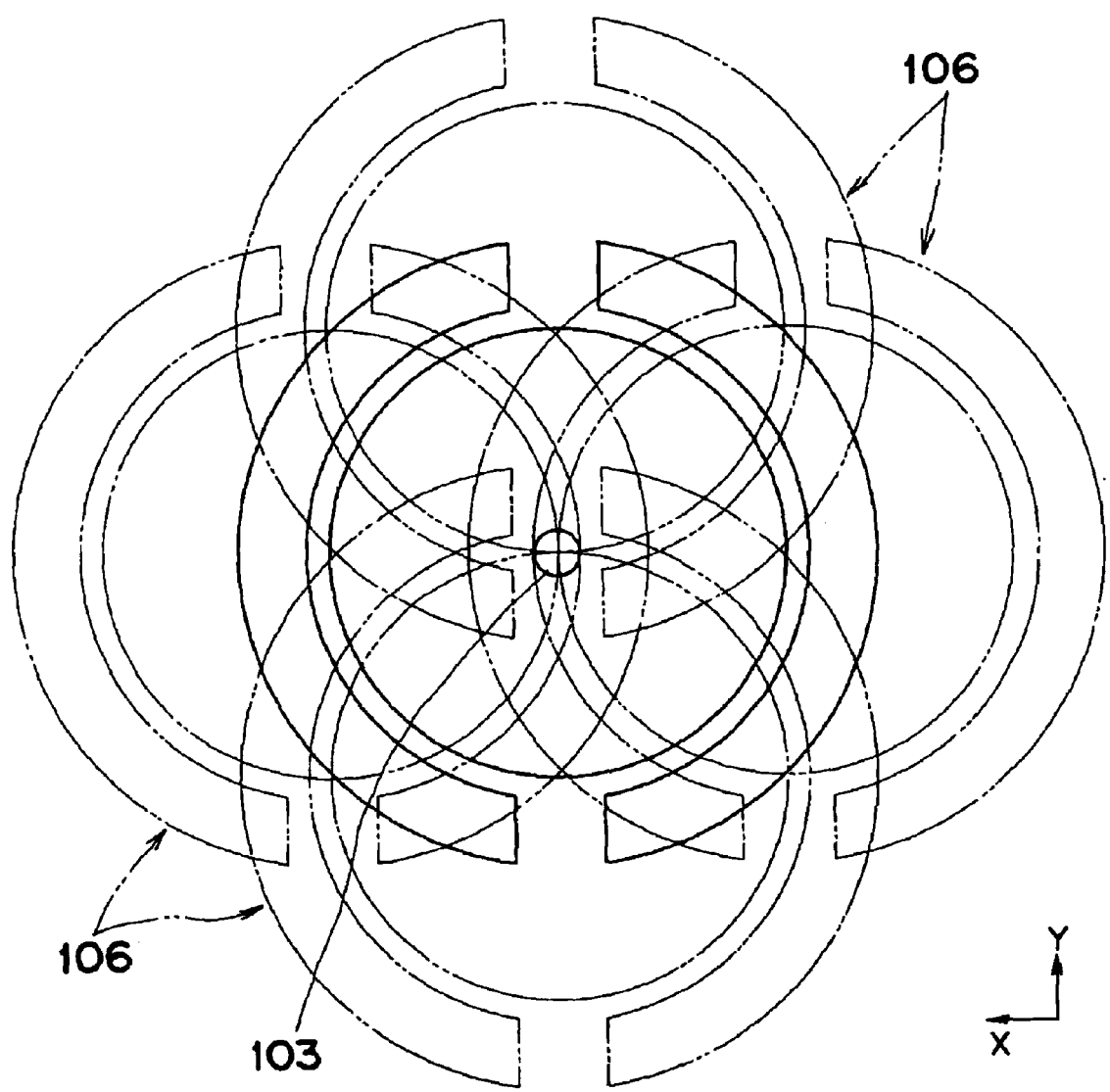
FIG. 18 is an explanatory view showing a region range in the case of moving in conventional X direction and Y direction.

Thus, a range of the supporting body 6 moving in the X and Y direction along which the semiconductor element 2 is arrayed and feeding the semiconductor element 2 to pickup operation by the suction nozzle 3 is the range shown with a maximum moving position 62 in the X direction, a maximum moving position 63 in the Y direction, and a maximum moving position 64 in the X and Y composite direction, each from a reference position 61 of the supporting body 6 in FIG. 1. This is a size range seen in the two component array directions in one unit region set by dividing the component supporting region D of the supporting body 6 about the pickup position C into a plurality of regions, which is smaller than that in the case of using the whole component supporting region D as a moving range (see FIG. 18).

Figure 16:
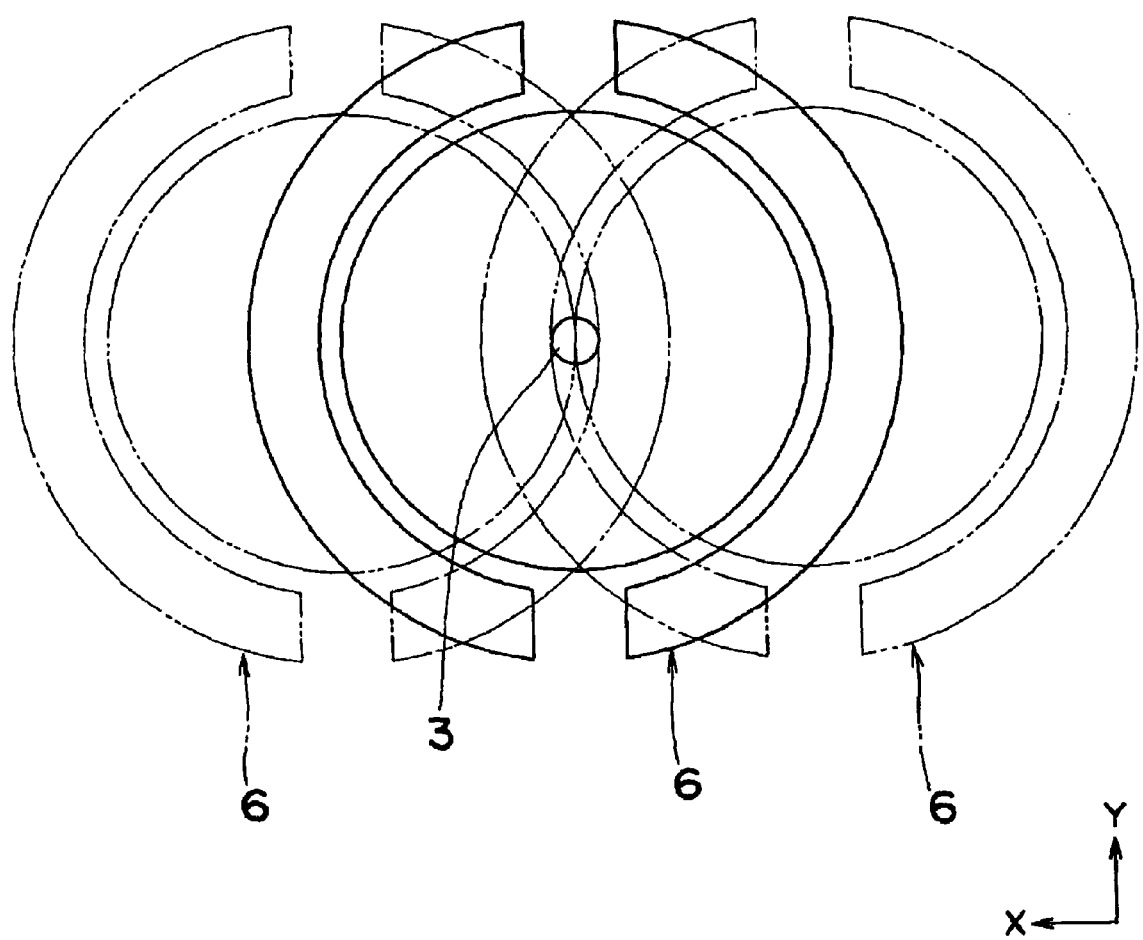
FIG. 16 is an explanatory view showing a unit region set to be a half region divided in X direction at an angle of 180 degrees as one modified example of the first embodiment of the present invention.
Figure 17:
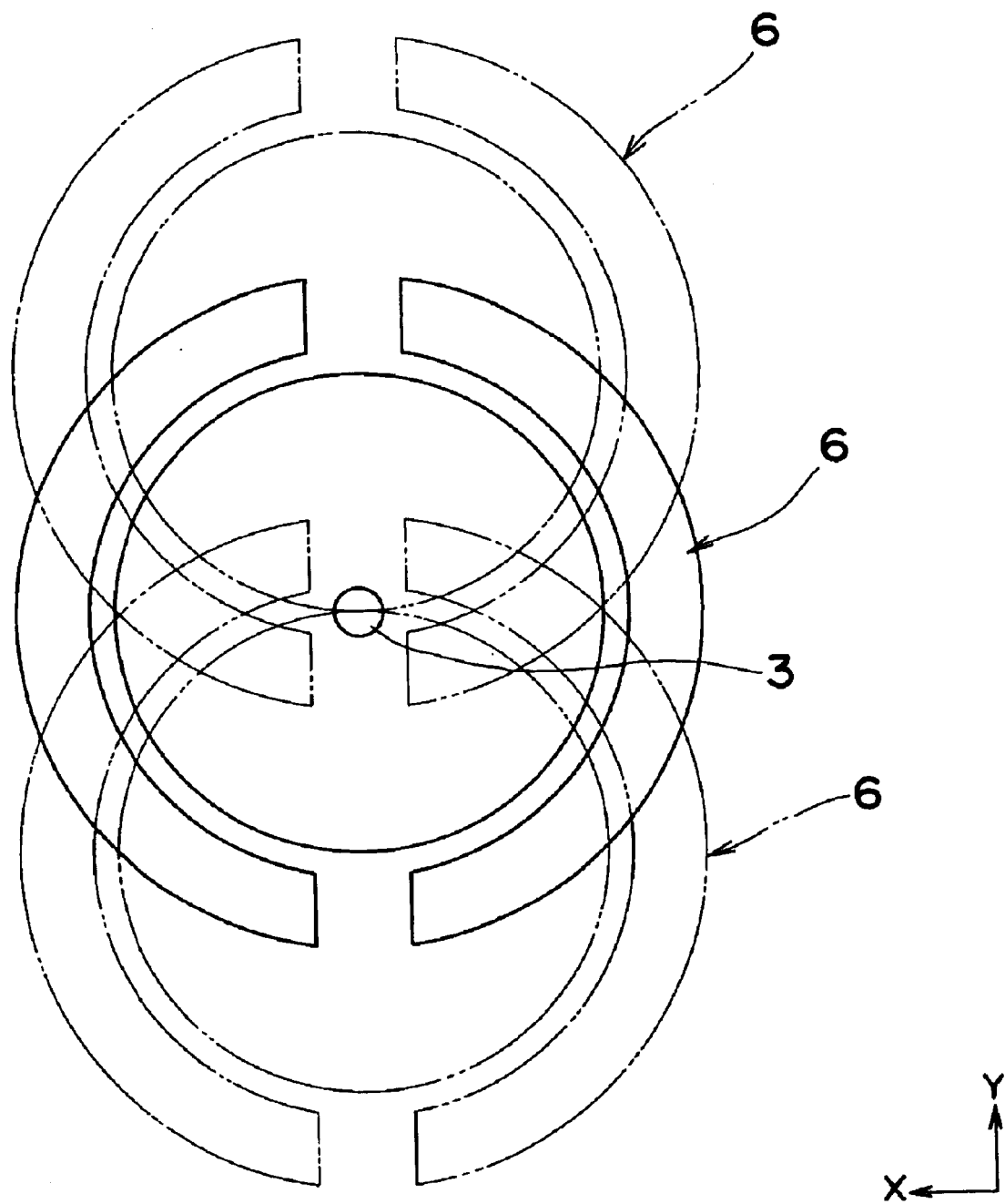
FIG. 17 is an explanatory view showing a unit region set to be a half region divided in Y direction at an angle of 180 degrees as another modified example of the first embodiment of the present invention.

For example, when the unit regions D1 to D4 are quarter regions divided at an angle of 90 degrees as in the case of the handling apparatus according to the first embodiment of the present invention as shown in FIG. 1, the maximum moving range in the two X and Y component array directions along the directions of one unit region D1 being adjacent to a unit region D2 and D3 on both sides thereof is reduced by half compared to the conventional case. As shown in FIGS. 16 and 17, when unit regions are half regions divided at an angle of 180 degrees, the maximum moving range in one component array direction X or Y along the direction of two divided unit regions being disposed side by side is reduced by half. More particularly, FIG. 16 shows the case where unit regions are set as half regions divided at an angle of 180 degrees in the X direction, where the maximum moving range in one component array direction X along the X direction in which two divided unit regions are disposed side by side is reduced by half. FIG. 17 shows the case where unit regions are set as half regions divided at an angle of 180 degrees in the Y direction, where the maximum moving range in one component array direction Y along the Y direction in which two divided unit regions are disposed side by side is reduced by half. It is noted that although unit regions may take other division numbers in theory, a moving direction of the supporting body 6 and an array direction of the semiconductor element 2 are not matched in other division numbers, which complicates position setting for moving each semiconductor element 2 to the pickup position C. An attempt to match the moving direction of the supporting body 6 not only with the two X and Y directions shown in FIG. 1, but with the array direction of the semiconductor element 2 increases necessary moving directions of the supporting body 6, thereby causing apparatuses to have complicated structure.

On the contrary, a plurality of unit regions D1, D2, . . . dividedly set on the supporting body 6 are switched to be positioned at the pickup standby position E, where each semiconductor element 2 is fed to pickup operation by the suction nozzle 3 with a movement of the supporting body 6, by rotation of the supporting body 6 at a specified position about an approximately central position of the supporting body 6 in the component supporting region D, that is about the pickup position C in the first embodiment, so that each semiconductor element 2 is fed to the pickup operation. Consequently, it is not necessary to move the supporting body 6 beyond the moving range shown with the positions 61 to 64 for feeding all the semiconductor elements 2 in each unit region D1, D2, . . . to pickup operation with the movement.

Therefore, space can be saved commensurate with division of the component supporting region D of the supporting body 6 about the pickup position C, proving the effectiveness since considerable reduction of necessary space can be achieved with small division such as division at an angle of 90 degrees. In addition, the pickup position remains unchanged. For example, in division at an angle of 180 degrees and 90 degrees, a relation between the component array direction and the moving direction of the supporting body may be kept unchanged. Consequently, positioning for feeding each semiconductor element 2 to the pickup operation of the semiconductor element 2 can be easily implemented by position switching through rotation without taking extra time.

Figure 2:
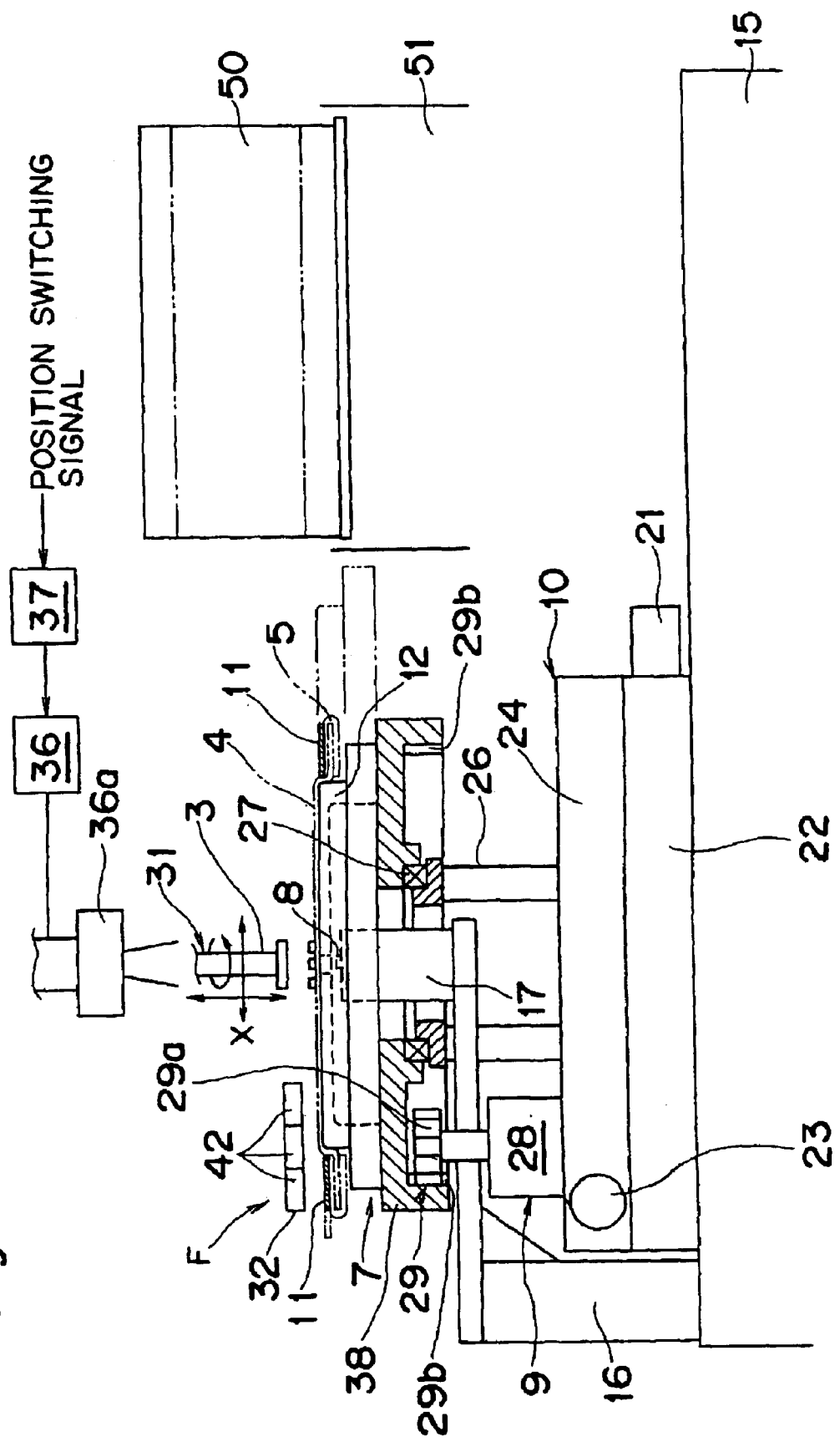
FIG. 2 is a front view showing a part of the apparatus of FIG. 1.
Figure 4:
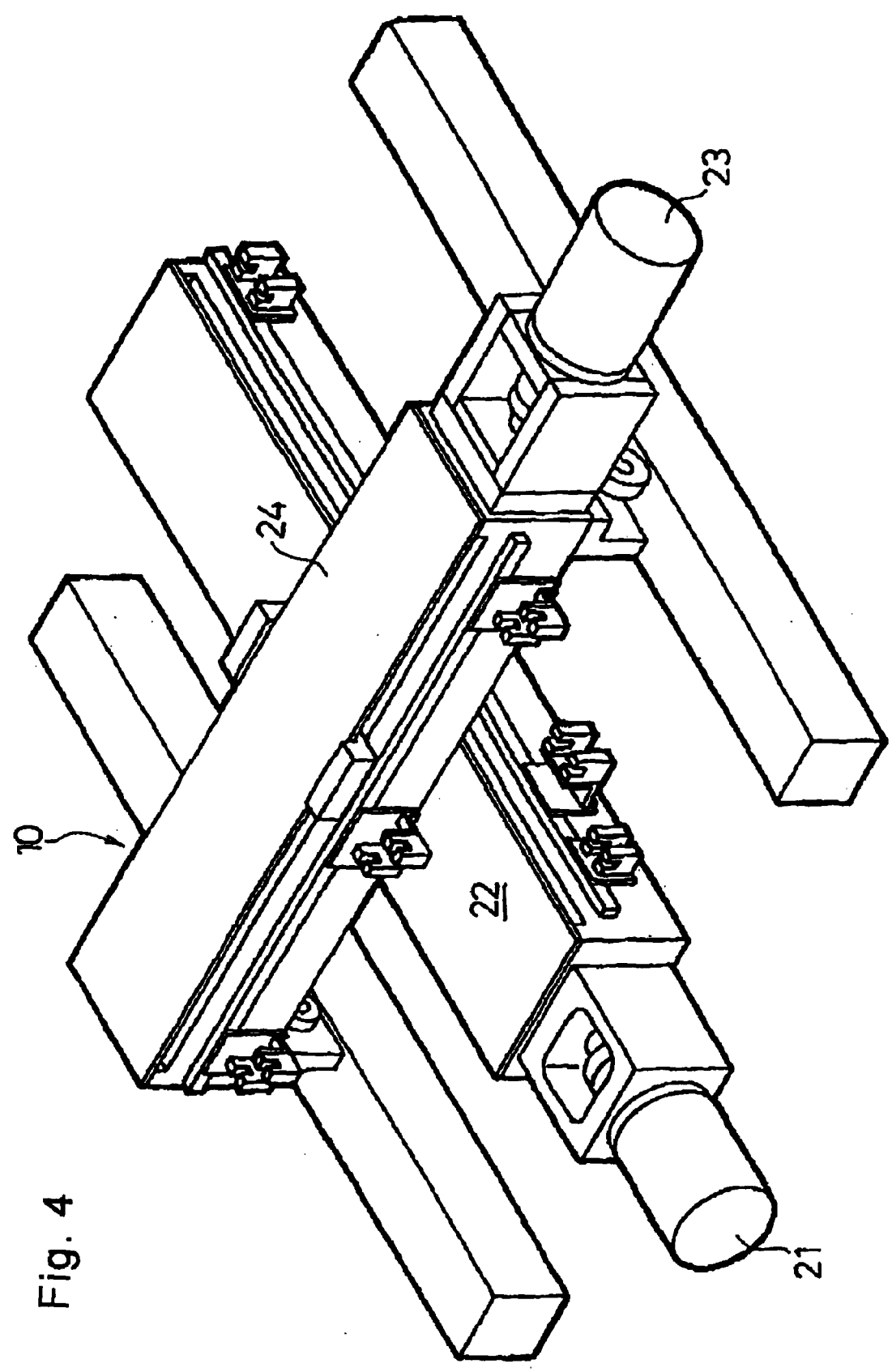
FIG. 4 is a perspective view showing a two-direction moving device in the component receiving section in the apparatus of FIG. 1.

The feeding device of arrayed components in the first embodiment that implements the above method is provided with a component receiving section 7 on the base 15 as shown in FIGS. 1 to 3 and 5, which receives, holds and expands the supporting body 6 for supporting diced semiconductor elements 2 arrayed in the orthogonal X and Y directions. The component receiving section 7 has a push-up pin 8 for pushing up one semiconductor element 2 at the pickup position C from lower side to help pickup operation. Accordingly, the feeding device of arrayed components is composed of: a receiving section rotating device 9 as shown in FIG. 2 for positioning in a switching manner each unit region D1 to D4 set by dividing the component supporting region D of the supporting body 6 received in the component receiving section 7 about the pickup position C into a plurality of regions at the pickup standby position E around the pickup position C by rotating the component receiving section 7 about the pickup position C; and a two-direction moving device 10 as shown in FIGS. 2 and 4 for moving the component receiving section 7 in the two component array directions X and Y, and positioning the semiconductor elements 2 in the unit region positioned at the pickup standby position E on the supporting body 6 one by one at a specified pickup position C so as to feed the semiconductor elements 2 to pickup operation by the suction nozzle 3.

The component receiving section 7 is composed of a placing base 12 as shown in FIGS. 2 and 3 for placing the supporting body 6 as shown in FIGS. 1 to 3, and a two-split pressing board 11 provided to press a supporting metal fitting 5 of the supporting body 6 placed on the placing base 12 from its upper side. The two-split pressing board 11 is combined so as to be ascended or descended against the placing base 12, and ascending and descending operation of the two-split pressing board 11 is achieved by an actuator 13 such as solenoid. In the component receiving section 7, in the state that the two-split pressing board 11 is ascended, the supporting body 6 is received from the lateral side and placed on the placing base 12. An inside portion of the supporting metal fitting 5 of the supporting body 6, that is a portion of the dicing sheet 4 exposed from the supporting metal fitting 5, is supported by the placing base 12 from lower side. Also, the supporting body 6 supporting the dicing sheet 4 is extracted to the lateral side.

The pressing board 11 is descended after the supporting body 6 is received on the placing base 12 and the dicing sheet 4 is supported, so that the pressing board 11 can depress the supporting metal fitting 5 around the dicing sheet 4 supported by the placing base 12 by a specified amount as shown in FIG. 2. As a result, the dicing sheet 4 is expanded equally in each direction from the center thereof on the placing base 12, which extends array pitch of each semiconductor element 2 placed thereon, and thus pulls each semiconductor element 2 apart. In this state, each semiconductor element 2 is subjected to pickup operation by the suction nozzle 3 as stated above. Upon completion of pickup operation of the semiconductor element 2, the pressing board 11 is ascended to stop expansion of the dicing sheet 4 and release the supporting body 6. This makes the supporting body 6 with the semiconductor elements 2 picked-up ready to be extracted, and replacement with a new supporting body 6 enables sequential pickup of necessary number of semiconductor elements 2.

The push-up pin 8 is supported by a frame 16 provided on the base 15 as shown in FIG. 2, and is structured to be moved upward and downward at the pickup position C by an actuator 17 such as solenoid. The push-up pin 8 is moved upward after one of the semiconductor elements 2 on the supporting body 6, or in other words, on the dicing sheet 4, is positioned at the pickup position C, so that the push-up pin 8 can lift the semiconductor element 2 positioned at the pickup position C by a specified amount for pickup operation and can position the same higher than other semiconductor elements 2.

The separation of each semiconductor element 2 by expansion of the dicing sheet 4 and the pushing-up thereof at the pickup position C enable each semiconductor element 2 positioned at the pickup position C to be easily and securely sucked and picked up one by one by the suction nozzle 3 without being bothered by surrounding semiconductor elements 2 or causing displacement of surrounding semiconductor elements 2.

The two-direction moving device 10, composed of X and Y tables, is disposed on the base 15 so as not to interfere with the frame 16 of the push-up pin 8 as shown in FIGS. 2 and 4. The two-direction moving device 10 is composed of an X table 22 to be moved on the base 15 in the X direction by an X-direction driving motor 21, and a Y table 24 to be moved on the X table 22 in the Y direction by a Y-direction driving motor 23. The component receiving section 7 is supported on the Y table 24 so as to be moved in these X and Y two directions.

The receiving section rotating device 9 is newly provided in the feeding device of the arrayed components. As shown in FIG. 2, the receiving section rotating device 9 supports the component receiving section 7 on the two-direction moving device 10 via a bearing 27 with a frame 26 provided so as not to interfere with the frame 16, the push-up pin 8, and other supporting mechanisms even with a movement of the two-direction moving device 10 in the X and Y directions for enabling the component receiving section 7 to rotate around the pickup position C, and also rotatively drives the supported component receiving section 7 as necessary with a motor 28 and a gear mechanism 29 disposed on the two-direction moving device 10 so as not to interfere with the frame 16, the push-up pin 8, and other supporting mechanisms even with a movement of the two-direction moving device 10 in X and Y directions. More specifically, a drive gear 29a is fixed to a rotation axis of the motor 28. A turntable 38 of the component receiving section 7 to which the placing base 12 is fixed is supported by the frame 26 in a rotatable manner through the bearing 27, and is provided with a gear 29b in a peripheral portion of the lower inside thereof, so that the gear 29b is geared with the drive gear 29a. Consequently, rotative driving of the motor 28 rotates the drive gear 29a of the motor 28, which in turn rotates the gear 29b geared with the drive gear 29a. As a result, the turntable 38 of the component receiving section 7 rotates against the frame 26 via the bearing 27, which makes the placing base 12 on the turntable 38 rotate.

The receiving section rotating device 9 rotates the component receiving section 7 about the pickup position C, so that the receiving section rotating device 9 can position in a switching manner each unit region D1 to D4, which are in the component supporting region D on the supporting body 6 received by the component receiving section 7, in sequence at the pickup standby position E for feeding the semiconductor element 2 to pickup operation. By moving the component receiving section 7 in the X and Y direction after each unit region D1 to D4 is switched to be positioned at the pickup standby position E, the two-direction moving device 10 can position all individual semiconductor elements 2, which are in one unit region switched to be positioned at the pickup standby position E, at the pickup position C in sequence, for sequential pickup by the suction nozzle 3.

In view of the forgoing, while extra plane space is not necessary for providing the receiving section rotating device 9 for rotating the component receiving section 7, all the diced semiconductor elements 2 on the supporting body 6 received in the component receiving section 7 can be fed to pickup operation under conditions similar to conventional conditions without failing space saving in the above method including expanding processing. Therefore, the present invention is advantageous in coping with larger-size semiconductor wafer 1 in terms of space saving of the feeding device of arrayed components.

Figure 5:
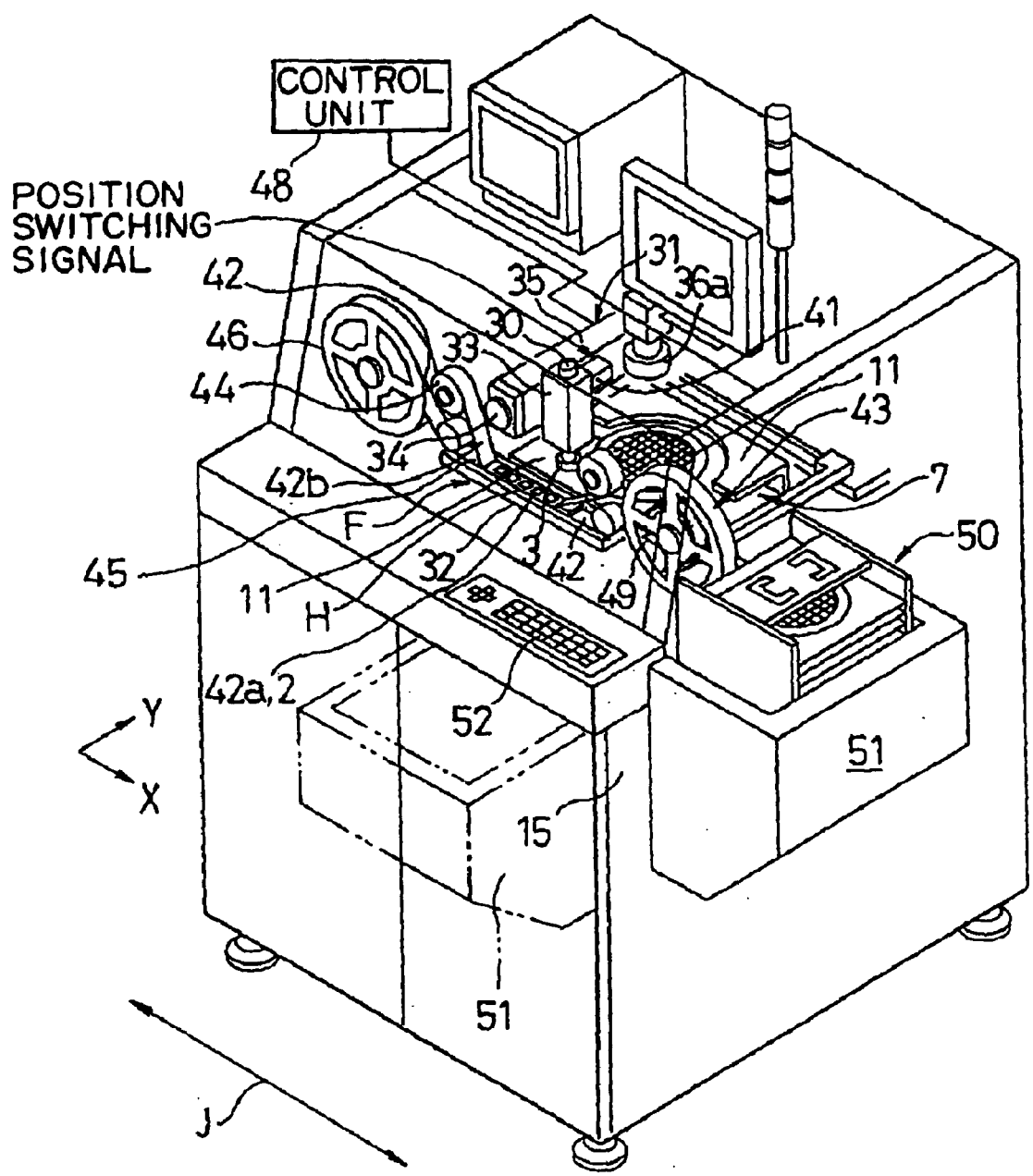
FIG. 5 is a perspective view showing an overall structure of the apparatus of FIG. 1 as a housing device.
Figure 6A:
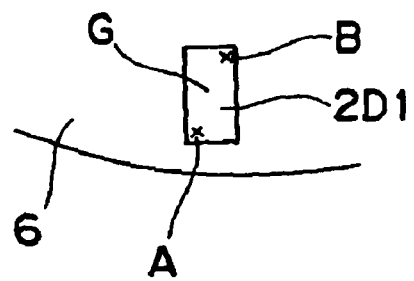
FIGS. 6A, 6B, 6C, and 6D are explanatory views showing change in position and direction of a supported semiconductor element and a positional reference point thereof due to rotation of a supporting body by the apparatus of FIG. 1.
Figure 6B:
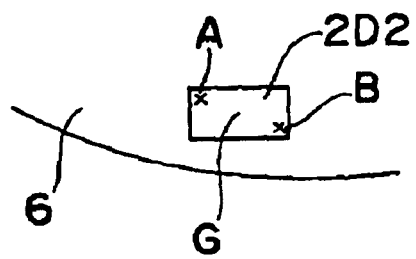
Figure 6C:
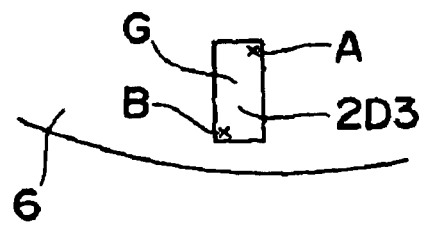
Figure 6D:
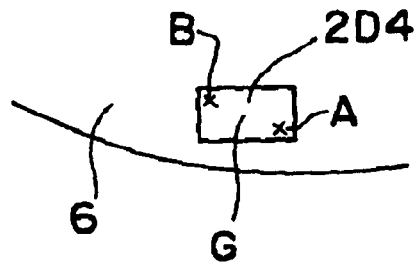

Such feeding device of the arrayed components is, as shown in FIG. 5, combined with a component transfer device 31 for picking up a semiconductor element 2 that are positioned at the pickup position C with use of the suction nozzle 3 and transferring it to other places, to constitute a transfer device of arrayed components for executing practical operation of component transfer. As shown in FIG. 5, the component transfer device 31 is structured to have a suction nozzle 3 placed on a transfer head 33 such that the suction nozzle 3 is moved upward and downward by an actuator 30 such as elevating cylinders, and to be supported by a Y table 35 that reciprocates the transfer head 33 in the Y direction between the pickup position C and a component transfer target position F for setting a component housing section 32 etc. with use of a Y-direction drive motor 34.

Accordingly, each one of diced semiconductor elements 2 to be arrayed on the supporting body 6 is fed to the pickup position C while space saving is implemented. After the component transfer device 31 picks up the semiconductor element 2 with use of the suction nozzle 3 moving downward, sucking, and moving upward, the picked-up semiconductor element 2 is carried to a specified location, where the semiconductor element 2 is transferred to top of the transfer target position F with use of the suction nozzle 3 moving downward, stopping suction, and moving upward, and is fed to following handling.

Also, the transfer device of arrayed components in the first embodiment is equipped with an identifying device 36 including an identifying (recognizing) camera 36a that images the semiconductor element 2 at the pickup position C and performs image recognition as shown in FIGS. 1 and 2, as well as a reference position switching device 37 that switches reference of position recognition by the identifying device 36 after the unit region positioned at the pickup standby position E is switched with rotation of the supporting body 6 by the receiving section rotating device 9.

Normally, semiconductor elements 2 on the supporting body 6 are arrayed in the same direction if they are the same components, and have common position reference for recognizing direction and position in various handling after pickup operation such as processing, assembling, housing, and mounting. Examples of the position reference include two points A and B locating on the diagonal line of a semiconductor element 2 as shown in FIGS. 6A, 6B, 6C, and 6D. Regardless of whether the semiconductor element 2 has the shape of a square or a rectangle, the position reference is used to identify direction and position around the center G.

For simplicity's sake of the explanation, the case of the semiconductor element 2 with the shape of a rectangle is shown in the drawings. Shown are semiconductor elements 2D1 to 2D4 that come to almost the same position at the pickup standby position E in each unit region D1 to D4 shown in FIG. 1. It is indicated that the directions of these semiconductor elements when they reach the pickup standby position E and the positions of the positions reference points A and B are each different as shown in FIGS. 6A, 6B, 6C, and 6D. The difference is determined by a rotation angle of the supporting body 6, so that depending on which of the unit regions D1 to D4 is located at the pickup standby position E, the rotation angle of the semiconductor element 2 at the position from the positions reference points A and B is known.

By utilizing this structure, after the reference position switching device 37 receives a position switching signal informing that each of the unit regions D1 to D4 is switched to be positioned at the pickup standby position E by rotation around the pickup position C, the reference position switching device 37 switches reference of position recognition of the identifying device 36 to copy with gradual displacement of the direction of the semiconductor elements 2 of each unit region positioned at the pickup standby position E, i.e., gradual displacement of the direction of the position reference points A and B, by a specified angle around the center of the component, in response to a rotation amount of the supporting body 6, thereby making it possible to prevent failure of recognizing the direction or position of the semiconductor element 2 as well as decrease of recognition accuracy.

Also, in the first embodiment, there is provided a tool rotating device 41, as shown in FIG. 5, for rotating the suction nozzle 3 about the center of a semiconductor element 2 to be picked up thereby. The tool rotating device 41 is composed of a motor. After the control unit 48 receives a position switching signal informing that each unit region positioned at the pickup standby position E is switched with rotation of the supporting body 6 by the receiving section rotating device 9, the control unit 48 corrects the direction of the semiconductor element 2 picked up by the suction nozzle 3 based on known data on the direction and position stored in a memory 300 connected to the control unit 48 by rotation of the suction nozzle 3 as shown in FIG. 19 under the control of the control unit 48. Therefore, if the direction of a semiconductor element 2 in each of the unit regions D1 to D4 positioned at the pickup standby position E is displaced by a specified angle around the center of the component in response to a rotating amount of the supporting body 6 as described above, the semiconductor element 2 can be aligned in a specified direction and transferred to a transfer target position F, thereby causing no inconvenience nor problems in handling the semiconductor element 2 in a specified direction after transfer.

Figure 7:
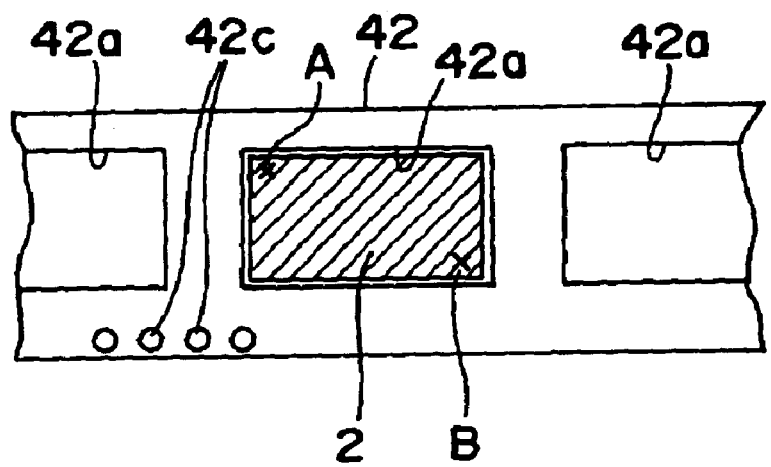
FIG. 7 is a plan view showing a tape member for use in a component housing section in the apparatus of FIG. 1.

The transfer device of arrayed components as stated above further constitutes a housing device of arrayed components by having a component housing section 32 as shown in FIG. 5 for housing the semiconductor element 2 picked up by the transfer target position F. The component housing section 32 can use various housing members including pallet members and tape members that are conventionally known as members for housing and holding components in an arrayed state. In the first embodiment as shown in FIG. 1, as an example of the component housing section 32, there is used a tape member 42 that performs housing operation by receiving the semiconductor element 2 as shown in FIG. 7 in a concave section 42a, and then covering it with a top tape 42b as shown in FIG. 5. Consequently, the holder 32 is composed of a tap member feeding section 43, a top tape feeding section 44, and a top tape attaching section 45 for feeding the tape member 42 by drive control of a motor or the like to a component housing position H where the tape member 42 is guided so as to receive components for receiving semiconductor elements 2, as well as a winding section 46 for winding housed part of the semiconductor elements 2 by drive control of a motor or the like.

As stated above, receiving the semiconductor element 2, which is picked up by the suction nozzle 3 and transferred by the component transfer device 31, in the concave section 42a of the tape member 42 provided and fed by the component housing section 32 makes it possible to accomplish housing and feeding of the semiconductor element 2 in a packing style as a taping component suitable for next handling by the tape member 42, by utilizing each necessary property in the above transfer operation.

For example, the tape member 42 is forwarded at a specified pitch with high accuracy with use of perforations 42c provided on one side shown in FIG. 7 by engaging with an unshown sprocket in the component housing section 32, by which each concave section 42a is positioned at a receiving position for receiving a transferred semiconductor element 2, and there are set with high accuracy the distance from the position of the perforation 42c to the central position of the concave section 42a, and the position of the concave section 42a in an advance direction. The semiconductor element 2 is received in the concave section 42a with a space of about 0.2 mm on both sides against the concave section 42a. This minimizes a displacement amount of each semiconductor element 2 against the tape member 42 in high-accurate handling of the tape member 42 for feeding of the semiconductor element 2 housed in the tape member 42 in a packaged style to next operation such as processing and mounting, thereby enabling easy handling of each semiconductor element 2 with good positioning accuracy, besides being in arrayed in a specified direction.

To support this structure, the component transfer device 31 is required to handle the semiconductor element 2 picked up by the suction nozzle 3 with good positioning accuracy. Otherwise, the semiconductor element 2 cannot be transferred and housed swiftly and securely in the concave section 42*a* that has a size setting as stated above. This requirement is satisfied by a switching function of recognition reference by the reference position switching device 37 in the transfer device of arrayed components and an angle correction function for the semiconductor element 2 by the tool rotating device 41, as well as by the component transfer device 31 performing, under control of the control unit 48, correction of the suction position by the suction nozzle 3, normally executed in the component transfer device, based on recognition results about the position and direction of the semiconductor element 2 that are positioned at the pickup position C recognized by the identifying device 36, or alternative correction of the position of the semiconductor element 2 that are picked up by the suction nozzle 3 and transferred to the transfer target position F. The semiconductor element 2, as one example, has about 1 to 20 mm square, and in larger-sized components, a small angle displacement can cause considerable displacement against the concave section 42*a* as an issue. This issue can be solved by achieving position accuracy of around + or −50 μm. The semiconductor element 2 can be handled with higher positioning accuracy if necessary.

Figure 9A:
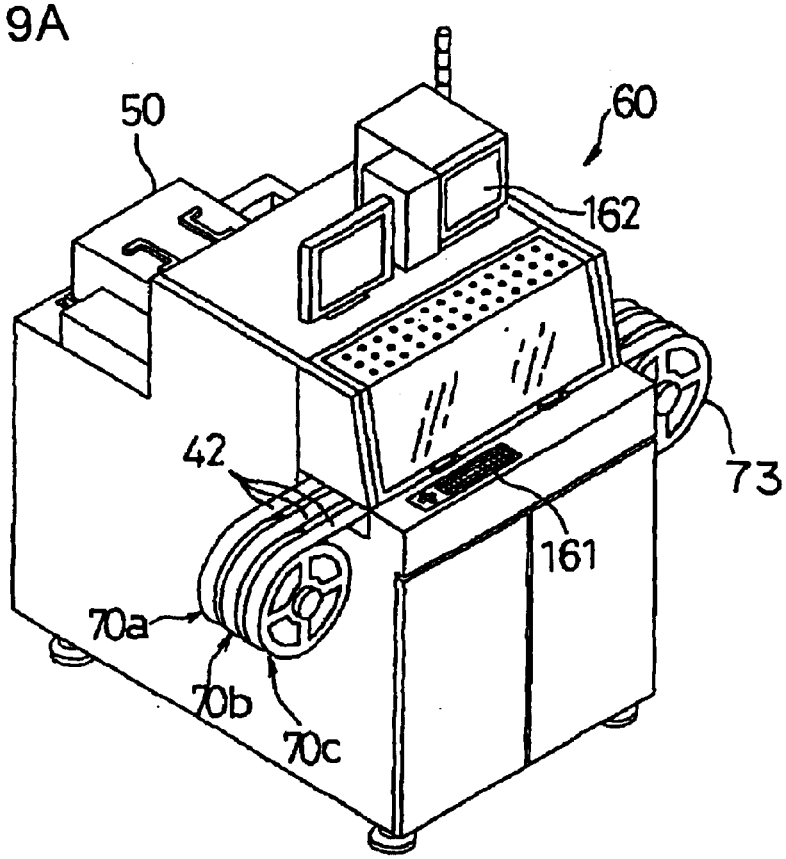
FIG. 9A is a perspective view showing an external appearance of the front side of a transfer device according to a third embodiment of the present invention.

The housing device of arrayed components in the first embodiment shown in FIG. 1 is further composed of three tape members 42 disposed together in the component housing section 32 as shown in FIG. 9A showing a third embodiment, and a control unit 48 as an example of a control means as shown in FIGS. 5 and 19, that controls transfer and housing of the semiconductor element 2 picked up by the suction nozzle 3 through separate usage of the three tape members 42 depending on the type of the semiconductor element 2 recognized by the identifying device 36.

After semiconductor elements 2 are formed on a semiconductor wafer 1 and diced and then it is generally determined whether the semiconductor elements 2 are good or bad in quality, a semiconductor element 2 defined as a defective product as a result of quality determination is marked for indication of the defectiveness as stated above. In this determination, quality rank of each semiconductor element 2 may be defined and rank indication may be made on each semiconductor element 2. The quality rank herein refers to a rank defined by characteristic of the semiconductor element 2, since there are cases that even if the same circuit is formed from semiconductor elements 2 on the same wafer, electric characteristics or frequency characteristics of each semiconductor element 2 are different.

Accordingly, in the case where different components with different quality rank are present in semiconductor elements 2 on the supporting body 6 including the case where different types of semiconductor elements 2 is formed on one semiconductor wafer 1, the presence of different components is determined by the control unit 48 based on the result of the identifying device 36, and the component transfer device 31 and the component housing section 32 are driven under control of the control unit 48 so as to separately use the different tape members 42 depending on the determined type of each semiconductor element 2 for housing the semiconductor element 2. This makes it possible to achieve feeding of each semiconductor element 2 transferred to the component housing section 32 for the application or handling conforming to the type or the rank thereof by utilizing the recognition function of the identifying device 36.

It is noted that although in the above description, quality or quality rank of the semiconductor element 2 is determined by the control unit 48 based on the result of the identifying device 36, it is also acceptable that quality examination is performed by the control unit 48 based on the result of the identifying device 36. It is also acceptable that the identifying device 36 recognizes a product whose quality rank is already marked in an examination process in the previous step.

Also, in the case where one type of the semiconductor element 2 is a defective product, the control unit 48 drives the component transfer device 31 to dispose the semiconductor element 2, which is determined as the defective product by the control unit 48 based on the recognition result of the identifying device 36, in a specified disposal section 49 shown in FIGS. 1 and 5. This makes it possible to achieve easy processing of defective products in the transfer cycle, thereby saving a special operational step.

The supporting body 6 supporting diced semiconductor elements 2 is typically housed inside a wafer housing cassette 50 in a specified number of rows and collectively handled per unit number as shown in FIGS. 1, 2, and 5. Accordingly, the housing device of arrayed components in the first embodiment shown in FIG. 5 is equipped with a feeding section 51 on one side face of the base 15, that constitutes an elevating mechanism of the supporting body 6 for holding and elevating the wafer housing cassette 50. The feeding section 51 elevates the supporting body 6 in the holding state by an amount corresponding to a housing pitch of the supporting body 6 so that one supporting body 6 is positioned at an inserting/extracting position to/from the component receiving section 7. The supporting body 6 positioned at the inserting/extracting position is extracted and forwarded to the component receiving section 7 by an unshown inserting/extracting mechanism (ex., a wafer extracting device 80 in the third embodiment) for feeding of the semiconductor element 2. The supporting body 6 that completes feeding of the semiconductor element 2 is housed at a previous position in the wafer housing cassette 50 by the inserting/extracting mechanism, and then next supporting body 6 is positioned at the inserting/extracting position. After all the supporting bodies 6 complete feeding of semiconductor element 2 by repeating the above procedure, the wafer housing cassette 50 is replaced with a new one, which is provided with a necessary number of semiconductor elements 2 and housed.

In the case of a semiconductor wafer 1 having a diameter of, for example, around 300 mm, if the semiconductor wafer 1 is housed in the wafer housing cassette 50 in about 10 rows and collectively handled in a conventional manner, the total weight thereof is about 20 kg, bringing potential difficulty to its handling. In this case, it is preferable to simplify a flow line and operation of an operator moving and operating around the device when he/she inserts or extracts the wafer housing cassette 50 to be fed in/from the feeding section 51. For example, in the case where housing devices of arrayed components as shown in FIG. 5 are adjacently disposed side by side seen from the front having an operation panel 52, a transport line for feeding the wafer housing cassette 50 to each device is in the direction and position shown with an arrow J indicating the front side of the device. In this structure, if the feeding section 51 is disposed on one of right and left side faces of the base 15 as shown in the drawing, the operator can replace the wafer housing cassette 50 that completes feeding of the semiconductor element 2 in the feeding section 51 only by lifting the transported wafer housing cassette 50 and stepping into the area ranging from the transport line J to the position of the feeding section 51, which is inconvenient for the operator. In addition, there is required a space for the operator to step in between adjacent devices, which is disadvantageous in terms of space saving. These issues remain almost unchanged if adjacent devices are different in types.

Accordingly, the feeding section 51 is disposed on the front side of the base 15 as shown with an imaginary line in FIG. 5, which enables the operator to facilitate replacement operation on the transport line J or between the transport line J and the device, and spares the stepping-in space for replacement operation between adjacent devices, thereby contributing to space saving.

(Second Embodiment)

Figure 8:
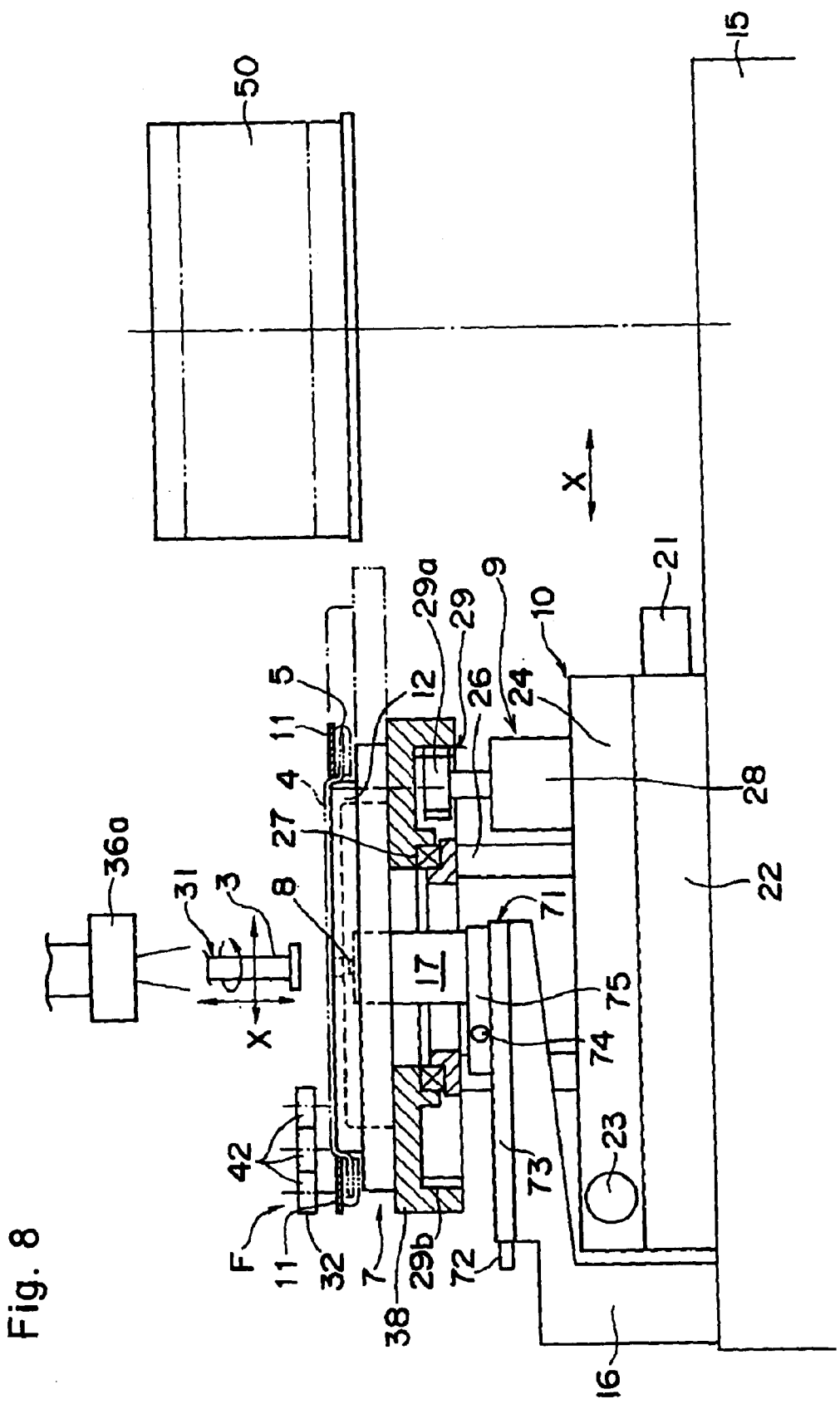
FIG. 8 is a front view showing a part of an apparatus for feeding, transferring, and housing arrayed components according to a second embodiment of the present invention.

A method and apparatus for handling arrayed components according to the second embodiment of the present invention shown in FIG. 8, and more specifically, a feeding method and device of arrayed components, a transfer device of arrayed components with use of the feeding device, and a housing device of arrayed components are structured such that a push-up pin 8 is supported by a push-up pin two-direction moving device 71 which moves the push-up pin 8 on the frame 16 in each X and Y direction, for moving the push-up pin 8 in the X and Y two directions. The push-up pin two-direction moving device 71 is composed of X and Y tables, and is disposed on the frame 16 so as not to interfere with the two-direction moving device 10 nor the frame 26 as shown in FIG. 8. The push-up pin two-direction moving device 71 is composed of an X table 73 to be moved on the frame 16 in the X direction by an X-direction driving motor 72, and a Y table 75 to be moved on the X table 73 in the Y direction by a Y-direction driving motor 74. The push-up pin 8 and a push-up pin-use actuator 17 such as solenoid are supported on the Y table 75 so as to be moved in these X and Y two directions.

Consequently, for moving each semiconductor element 2 to a pickup position by the component receiving section 7 moving the supporting body 6 in the X and Y direction, the push-up pin 8 is moved in a direction opposed to the moving direction thereof by the push-up pin two-direction moving device 71. As a result, the push-up pin 8 comes halfway to get the semiconductor element 2 during being moved, and a point in which both of them are met is set as a pickup position C for feeding the semiconductor element 2 to pickup operation by the suction nozzle 3. This further reduces by half a moving range and moving time necessary for the supporting body 6 to feed the semiconductor element 2 in each of the unit regions D1 to D4 to pickup operation with compared to the first embodiment shown in FIGS. 1 to 7. Although the pickup position C changes, the changed position is known so that it is easy to cope therewith. As other structures and effects to be implemented have no particular change from those in the first embodiment, duplicated illustrative description will be omitted here.

It is noted that in theory, space saving is achieved as with the case of the first embodiment, by moving the push-up pin 8 in sequence to a central position, that is a dividing reference point in place of the pickup position C of each of the unit regions D1 to D4 in the first embodiment, without rotating the supporting body 6, setting the position as the pickup position C, and using one out of each pickup position C set for each of the unit regions D1 to D4, that is corresponding to each of the unit regions D1 to D4, for feeding to pickup operation of the semiconductor element 2 with a movement of the supporting body 6 in the X and Y two directions. In this case, a method for moving the push-up pin 8 not only in the X and Y two directions, but also in a turning manner around the dividing reference point in each of the unit regions D1 to D4 is also applicable. However, controlling the push-up pin 8 so as to come to get the semiconductor element 2 being moved toward the pickup position C with use of the movement in the X and Y direction enables, in this modified method, further space saving and reduction of time similar to the case of the second embodiment. Furthermore, rotation of the supporting body 6, and therefore the rotation mechanism of the component receiving section 7 are saved.

According to the first and second embodiments of the present invention, space saving commensurate with division of the component supporting region of the supporting body around the pickup position implements downsizing and cost reduction of the apparatus, as well as reduction of expensive running cost of the clean room, thereby making the present invention preferable for supporting larger semiconductor wafers.

(Third Embodiment)

The following description discusses a method and apparatus for handling arrayed components according to the third embodiment of the present invention, and more specifically, a feeding method and device of arrayed components, a transfer device of arrayed components with use of the feeding device, and a housing device of arrayed components, with reference to accompanied drawings for understanding of the present invention. It is understood that the third embodiment described below is one embodiment of the present invention, and the technical scope of the present invention is not limited thereby. Since the third embodiment has many characteristics in common with the first embodiment, it will be described with reference to drawings and description of the first embodiment in an appropriate manner.

Before description of the third embodiment of the present invention proceeds, the background thereof will be described first.

Semiconductor elements, such as IC chips, are formed in a large number in longitudinal and lateral directions on a semiconductor wafer as integrated circuits, and divided into an individual integrated circuit by dicing. The IC chips are not only processed to be an IC component packaged by such processing as mounting, bonding, and molding, but also used for mounting as a bear IC on a circuit board. In each case, diced IC chips need to be transferred to other places to be processed so as to be suitable for each application.

By the dicing shown above, the IC chips are in the state of being held on a dicing sheet in array in the orthogonal X and Y two directions on an XY plane, the dicing sheet constituting a supporting body backed up by a backup member for enabling stable handling of the IC chips. The supporting body is moved in the X and Y direction along which the IC chips are arrayed, for moving each IC chip in sequence to a pickup position, where the IC chip is pushed up from lower side of the dicing sheet so that the dicing sheet with non-oriented elasticity is expanded, thereby enabling the pushed-up IC chip to be easily picked up by a component handling tool. The IC chip is transferred to a specified position by the component handling tool that picked up the IC ship.

As stated above, the IC chip individually separated from the semiconductor wafer is in the state of a bear chip not yet coated by resin molding or the like. Mounting the IC chip in this bear chip state on a circuit board implements high density packaging. Providing the IC chip for mounting on the circuit board requires component packaging of the IC chip so as to be fed to an electronic component mounting apparatus. Conventionally, the IC chip has been typically fed to the electronic component mounting apparatus as a tray pack to be housed in a tray provided with individual partitions, or as a gel pack to be attached and disposed on the surface of a low adhesive gel.

When the supporting body that supports a number of arrayed IC chips as shown above is moved in an array direction of the IC chips, and the IC chips are moved one by one to the pickup position so as to be picked up and transferred to a transfer destination by the component handling tool, a semiconductor wafer with larger diameter increases the distance from the pickup position to the transfer destination. Semiconductor wafers are getting larger in size, and some of them have a diameter of as large as 300 mm. In handling such a large semiconductor wafer, a moving distance of the component handling tool becomes longer, causing degradation of transfer tact for transferring a large number of IC chips.

Also, for mounting the IC chips on a circuit board, a taping packaging is effective as a package style for providing the IC chips to an electronic component mounting apparatus. As described before, a conventional package style of the IC chips is typified by a tray pack and a gel pack, and therefore provision by taping packaging has been demanded.

Also, in packaging IC chips, there are demanded the IC chip housed with an active plane thereof facing up and with an active plane thereof facing down depending on mounting forms of the IC chip on a circuit board. In order to package the IC chip in the demanded housing state, it is necessary to selectively invert front side and back side of the IC chip when it is transferred by the component handling tool.

It is an object of the third embodiment of the present invention to provide a method and apparatus for handling arrayed components including a feeding method and device of arrayed components, a transfer device using the feeding device, and a housing device, capable of suppressing increase of plane space of an apparatus in handling semiconductor wafers with a large diameter, suppressing degradation of transfer tact, implementing taping packaging of arrayed components such as semiconductor elements, and enabling selection of back and front direction of the semiconductor elements at the time of housing.

The third embodiment, similar to the first embodiment, exemplifies the case where a number of integrated circuits formed in longitudinal and lateral directions on a semiconductor wafer 1 are diced on a dicing sheet 4 into individual semiconductor elements 2 such as IC chips as shown in FIGS. 1 and 3, and the semiconductor element 2 in a state of being arrayed in two orthogonal directions is treated as an arrayed component, which is picked up one by one by a component handling tool for taping packaging.

Taping packaging of electronic components is well known as a packaging style of electronic components in which a tape that accommodates chip components such as resistors and capacitors is wound onto a reel. The taping packaging is regarded as a packaging style suitable for feeding electronic components to an electronic component mounting apparatus for manufacturing electronic circuit boards by surface mounting. For the taping packaging, there is set a taping standard, which is applied not only to the chip components but also to IC components. Consequently, the taping packaging is now regarded as the mainstream of the component packaging style for mounting of electronic components. However, the semiconductor element 2 obtained from the semiconductor wafer 1 and divided by dicing is in a bear state without resin molding, i.e., in the state of a bear chip, which is conventionally housed in a part tray or in a gel pack when fed to the electronic component mounting apparatus. The transfer method and device in the third embodiment enable taping packaging of the bear IC chip.

Figure 9B:
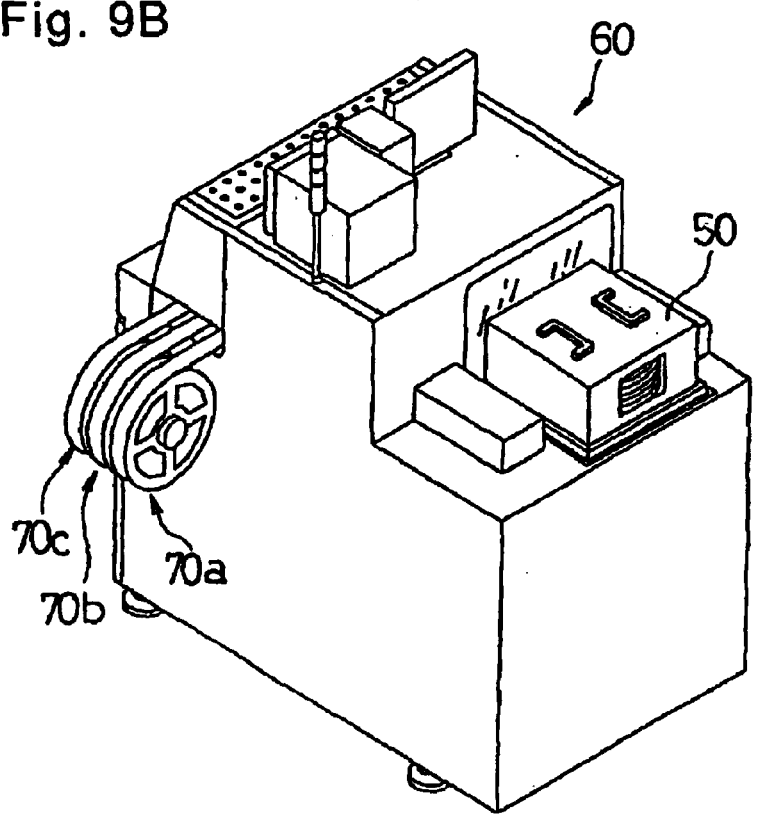
FIG. 9B is a perspective view showing an external appearance of the back side of the transfer device of FIG. 9A.
Figure 10:
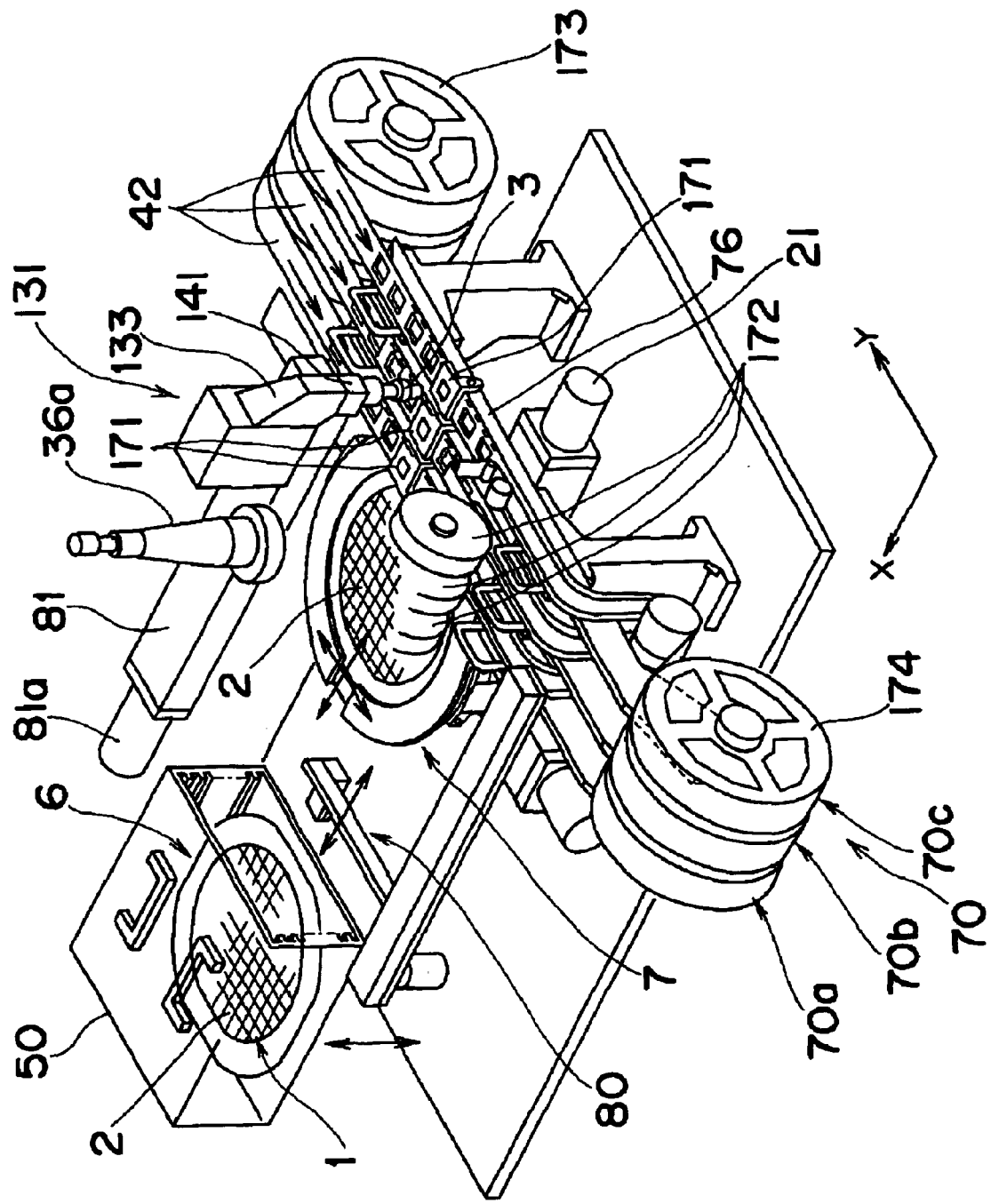
FIG. 10 is a perspective view showing the internal structure of the transfer device of FIG. 9A.
Figure 20:
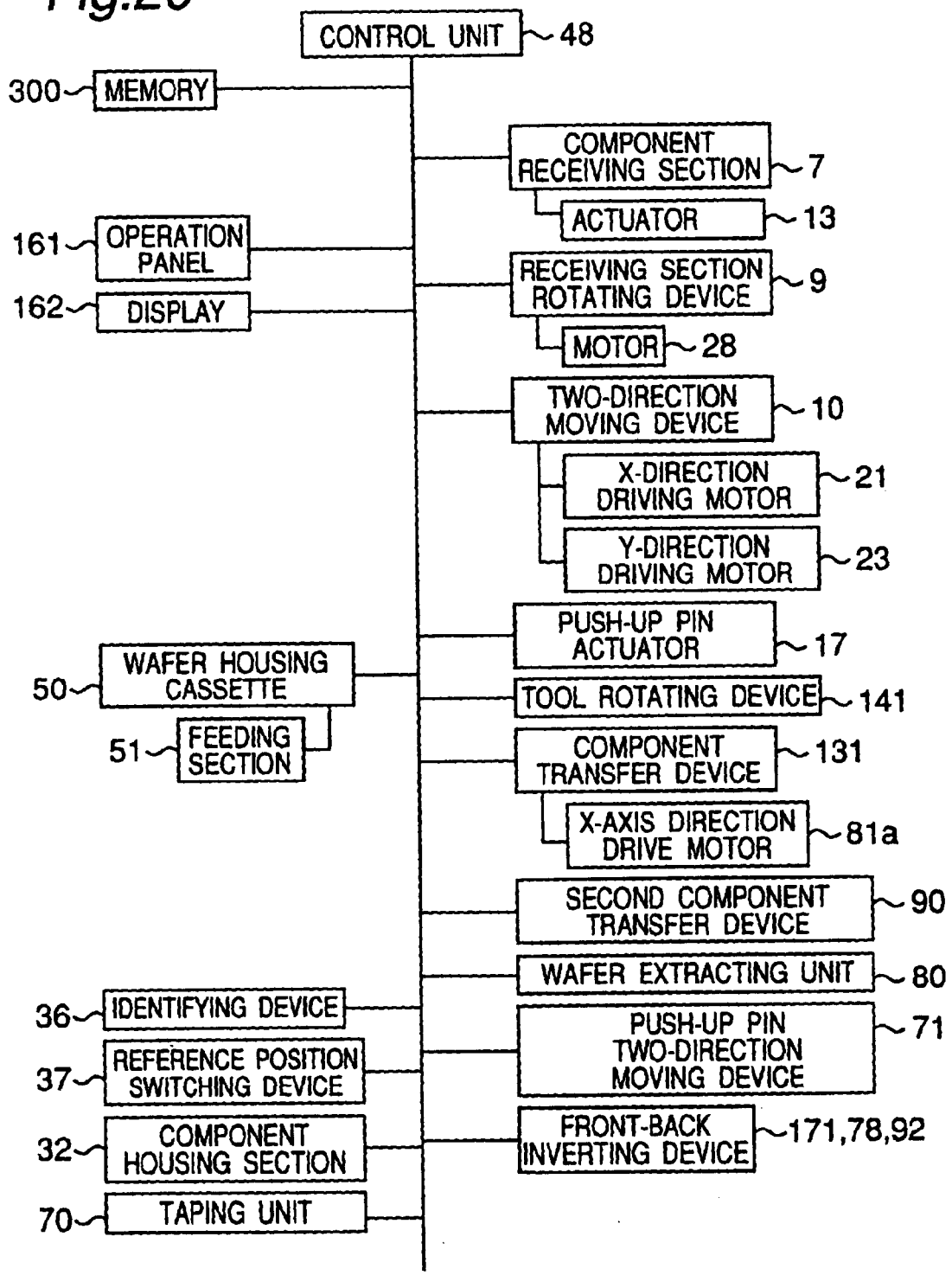
FIG. 20 is a block diagram showing a relation between a control unit and other devices in the apparatus for handling arrayed components in the third embodiment of the present invention.

FIGS. 9A and 9B show external appearance of a transfer device 60 of arrayed components in the third embodiment, which is provided with an operation panel 161 and a display 162 etc. disposed on the front side for setting operation and monitoring of the device operation, as well as a wafer housing cassette 50 (an example of the component feeding section) that houses a plurality of semiconductor wafers 1 disposed in a removable manner on the back side. The wafer housing cassette 50, if structured to allow replacement with use of a transport robot traveling in a transport route provided on the back side of the device, facilitates handling of large-size semiconductor wafers 1, and fulfils automatic replacement of the semiconductor wafers 1. FIG. 10 shows the internal structure of the transfer device 60 of the arrayed components, according to which the transfer device 60 is structured so that a plurality of semiconductor wafers 1 housed in the wafer housing cassette 50 are extracted one by one, and from the semiconductor wafer 1, semiconductor elements 2 are extracted one by one and transferred to top of the tape member 42 for taping packaging. It is noted that each operation of the apparatus for handling arrayed components in the third embodiment is controlled by the control unit 48 as shown in FIG. 20.

The semiconductor wafer 1 housed in the wafer housing cassette 50 is diced on the dicing sheet 4 and divided into individual semiconductor elements 2 in an arrayed state in the orthogonal two directions. The dicing sheet 4 has non-oriented elasticity, and is supported in an extended state by a ring-shaped supporting metal fitting 5, thereby constituting a supporting body 6 that enables stable handling and feeding. A plurality of the supporting bodies 6 housed in the wafer housing cassette 50 are extracted to a specified position, where as shown in FIGS. 1 and 2 of the first embodiment, each semiconductor element 2 is moved in sequence to the pickup position C with a movement of the supporting body 6 in the X and Y directions along the array directions of the semiconductor element 2. With push-up operation by the push-up pin 8 provided on the lower side of the pickup position C, only a semiconductor element 2 positioned at the pickup position C is in the state of protruding from other semiconductor elements 2, thereby enabling a suction nozzle 3 (an example of the component transfer device) to pick up the semiconductor element 2. The suction nozzle 3 that sucked the semiconductor element 2 moves to the top of the tape member 42, and houses the semiconductor element 2 in the tape member 42.

As described before, the semiconductor wafer 1 is getting larger in size. The semiconductor wafer 1 with a large diameter increases a distance for moving each semiconductor element 2 to the pickup position C, which causes decrease of production efficiency due to increased necessary time for moving the semiconductor element 2 in addition to increase in device size. To support such a large-size semiconductor wafer 1, a moving distance of the suction nozzle 3 is shortened by disposing the tape member 42 that is a transfer destination of the semiconductor element 2 so as to overlap with the supporting body 6, while a moving distance of the supporting body 6 in the X and Y direction is shortened by enabling rotation of the supporting body 6. In handling a semiconductor wafer 1 with a small diameter, rotation of the supporting body 6 is not necessary, though the tape member 42 is preferably disposed on the upper side of the supporting body 6 so as to be closer to the pickup position C.

Figure 11:
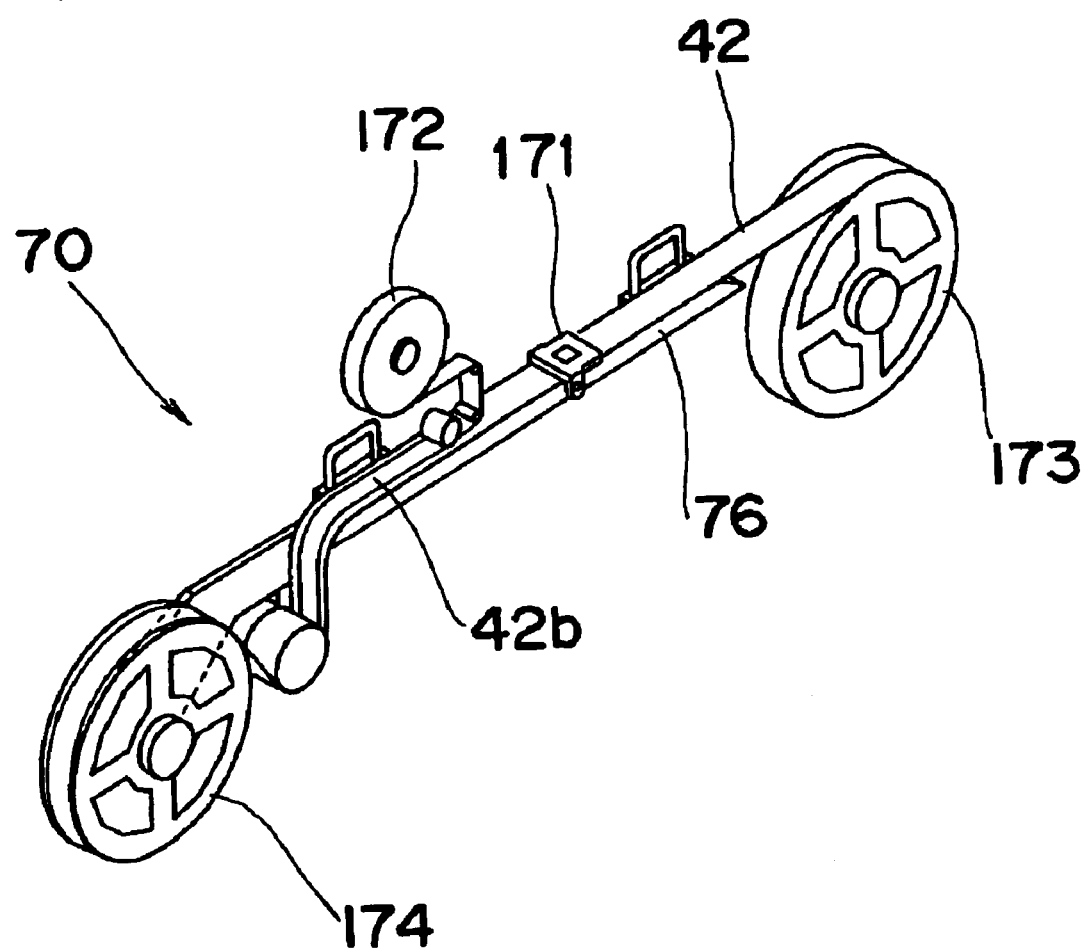
FIG. 11 is a perspective view showing the structure of a taping unit for use in the transfer device of FIG. 9A.

As shown in FIG. 11, the tape member 42 is structured to be fed intermittently by drive control of an unshown motor or the like from a feed reel 173 to a take-up reel 174 in a taping unit 70 that functions also as an example of a taping packaging section. On the tape member 42, there are formed a concave section 42a for housing the semiconductor element 2 and perforations 42C as shown in FIG. 7 of the first embodiment, where a distance between the position of the perforations 42c to the central position of the concave section 42a is set with high accuracy. The perforations 42c engage with an unshown sprocket of the taping unit 70 to feed the tape member 42 intermittently at a specified pitch with high accuracy. The concave section 42a is formed so as to provide very small space conforming to the size and form of a semiconductor element 2 to be housed therein, so that a displacement amount is reduced in a housing position for securing positioning accuracy in extracting the semiconductor element 2. The tape member 42 is sent off from the feed reel 173, and a semiconductor element 2 sucked by the suction nozzle 3 is sent through a later-described front-back device 171 or directly transferred to the inside of the concave section 42a. The concave section 42a to which the semiconductor element 2 is transferred is covered with a top tape 42b fed from a top tape reel 172 for secure housing and holding of the semiconductor element 2 in the tape member 42. The tape member 42 which houses the semiconductor element 2 and is covered with the top tape 75 is wound onto the take-up reel 174. Upon completion of housing of a necessary amount of semiconductor elements 2, the taping unit 70 is replaced.

In the third embodiment, the taping unit 70 is disposed in three rows as shown in FIGS. 9A, 9B, and 10. A plurality of the taping units 70 may be used for simultaneous execution of a plurality of taping packaging operations. However, the main reason why a plurality of the taping units 70 are disposed is for dividing semiconductor elements 2 by quality rank thereof and transferring them to each taping unit 70 per quality rank that is provided in three degrees. The quality rank herein refers to a rank defined by characteristic of the semiconductor element 2, since there are cases that even if the same circuit is formed from semiconductor elements 2 on the same wafer, electric characteristics and frequency characteristics of each semiconductor element 2 are different.

The quality rank and defectiveness of the semiconductor wafer 1 is determined per individual semiconductor element 2 by an examination. To identify the quality rank and defectiveness per positional address, each semiconductor element 2 on the semiconductor wafer 1 is subjected to mapping. The semiconductor wafer 1 is equipped with an identification system such as bar codes, by which mapping data per semiconductor wafer 1 is identified and inputted in the transfer device of arrayed components with use of a storage medium such as floppy disks. Therefore, with reference to data on the quality rank and defectiveness corresponding to a respective positional address stored in mapping data of the semiconductor wafer 1 recognized by the identifying device, a semiconductor element 2 moved to the pickup position C is transferred to the top of a respective tape member 42 corresponding to the determined quality rank. The semiconductor element 2, if determined as a defective product, is disposed in a disposal section 49 (see FIG. 1 of the first embodiment).

Following description discusses a method for transferring semiconductor elements 2 on the supporting body 6 housed in the wafer housing cassette 50 to the tape member 42, as well as a device structure thereof.

As shown in FIG. 10, as well as FIGS. 1 and 2 of the first embodiment, the wafer housing cassette 50 is fed from the back side of the device, and held by the feeding section 51 constituting an elevating mechanism, so as to be ascended or descended. In the wafer housing cassette 50, a plurality of the supporting bodies 6 supporting semiconductor elements 2 divided by dicing and arrayed in orthogonal two directions are housed. The supporting body 6 ascended or descended to a specified height by driving of the feeding section 51 is extracted by a wafer extracting unit 80, and placed on the placing base 12 from a lateral side in the state that the pressing board 11 of the component receiving section 7 is ascended as shown in FIG. 3 of the first embodiment. Ascending and descending operation of the pressing board 11 is achieved by the actuator 13. When the supporting body 6 is placed on the placing base 12, the pressing board 11 is descended and depresses the supporting metal fitting 5 around the dicing sheet 4 by a specified amount as shown in FIG. 2 of the first embodiment. As a result, the dicing sheet 4 is expanded equally in each direction from the center thereof on the placing base 12, which extends array pitch of each semiconductor element 2 supported thereon, and pulls each semiconductor element 2 apart. In this state, the component receiving section 7 is moved, and each semiconductor element 2 moved to the pickup position C is subjected to pickup operation by the suction nozzle 3.

As shown in FIG. 2 of the first embodiment, on the base 15, there is provided the two-direction moving device 10 composed of the X table 22 to be moved in the X direction by the X-direction driving motor 21, and the Y table 24 to be moved on the X table 22 in the Y direction by the Y-direction driving motor 23. On the Y table 24, there is supported the component receiving section 7, thereby the two-direction moving device 10 constituting the X and Y tables for moving in the X and Y two directions. Also, in order to handle a large-sized semiconductor wafer 1, there is provided a receiving section rotating device 9. The component receiving section 7 is supported by the bearing 27 so as to be able to rotate about the approximately central position of the supporting body 6 and is rotatively driven by the motor 28 and the gear mechanism 29 in an appropriate manner. More specifically, similar to the first embodiment, the drive gear 29a is fixed to the rotation axis of the motor 28. The turntable 38 of the component receiving section 7 to which the placing base 12 is fixed is supported by the frame 26 in a rotatable manner through the bearing 27, and is provided with the gear 29b in a peripheral portion of the lower inside thereof, so that the gear 29b is geared with the drive gear 29a. Consequently, rotative driving of the motor 28 rotates the drive gear 29a of the motor 28, which in turn rotates the gear 29b geared with the drive gear 29a. As a result, the turntable 38 of the component receiving section 7 rotates against the frame 26 via the bearing 27, which makes the placing base 12 on the turntable 38 rotate.

In the above structure, a semiconductor element 2 is moved in sequence to the pickup position C with movement of the supporting body 6 in the X and Y two directions. On the base 15, the push-up pin 8 is structured to be driven upward and downward by the actuator 17 supported by the frame 16. The semiconductor element 2 moved to the pickup position C is in the state being pushed up higher than other surrounding semiconductor elements 2 by ascendance of the push-up pin 8, and picked up one by one easily and securely by the suction nozzle 3 without being bothered by surrounding semiconductor elements 2 or causing displacement of surrounding semiconductor elements 2. As shown in FIG. 10, the suction nozzle 3 is operated by a transfer head 133 of a component transfer device 131 so as to enable elevating and rotating operation. The transfer head 133 may be moved on an X-axis rail 81 in the X direction by driving of an X-axis direction drive motor 81a, and may also be moved in the Y direction with movement of the X-axis rail 81 in the Y direction by an unshown Y-axis rail.

As shown in FIG. 10, as well as FIGS. 1 and 2 of the first embodiment, the taping unit 70 exemplifying the component housing section is disposed such that the tape member 42 is located so as to be laid over the component receiving section 7. The transfer head 133 sucking and holding the semiconductor element 2 located at the pickup position C with use of the suction nozzle 3 moves on the X-axis rail 81 to move the suction nozzle 3 on the upper side of the tape member 42. By descending the suction nozzle 3, the transfer head 133 houses the semiconductor element 2 in the concave section 42a formed in the tape member 42. By disposing the taping unit 70 so that part of the tape member 42 is laid over the upper side of the component receiving section 7 as stated above, a moving distance of the transfer head 133 from the pickup position C to the tape member 42 is shortened, thereby implementing improved transfer efficiency in handling of a large-sized semiconductor wafer 1.

As mapping of each semiconductor element 2 with quality rank determined by examination is already executed as stated above, the quality rank of a semiconductor element 2 sucked by the suction nozzle 3 is obtainable based on a mapping address thereof. In conformity with the obtained quality rank, the control unit 48 controls the moving distance of the transfer head 133 in the X direction, and houses the semiconductor element 2 in a respective tape member 42 of the taping unit 70 corresponding to the quality rank. If the quality rank is provided in three degrees: "a", "b", and "c", the taping unit 70 is disposed in three rows in response thereto. In controlling the moving direction of the transfer head 133 in the X direction in conformity with the quality rank, there are housed a semiconductor element 2 with the quality rank "a" in a taping unit 70a, a semiconductor element 2 with the quality rank "b" in a taping unit 70b, and a semiconductor element 2 with the quality rank "c" in the taping unit 70c, thereby enabling taping packaging of the semiconductor element 2 by the quality rank.

As shown in FIG. 10, the taping unit 70 is equipped with a front-back inverting device 171, which is operated for placing a semiconductor element 2 on the tape member 42 with the front side and back side thereof inverted. A semiconductor element 2 formed on the semiconductor wafer 1 is basically in the state with an active plane thereof facing up. When the semiconductor element 2 is transferred to the tape member 42, it is housed with the active plane facing up. Consequently, if the taping-packaged semiconductor element 2 is mounted on a circuit board by the electronic component mounting apparatus, it is mounted with its active plane facing up, so that electrodes on the active plane are electrically connected to circuit patterns of the circuit board by bonding. However, a mounting method on the circuit board is determined by a user using the semiconductor element 2, and therefore a method for mounting the semiconductor element 2 with the active plane facing down may be required. Housing of the semiconductor element 2 with the active plane facing down is implemented by the front-back inverting device 171.

Figure 21:
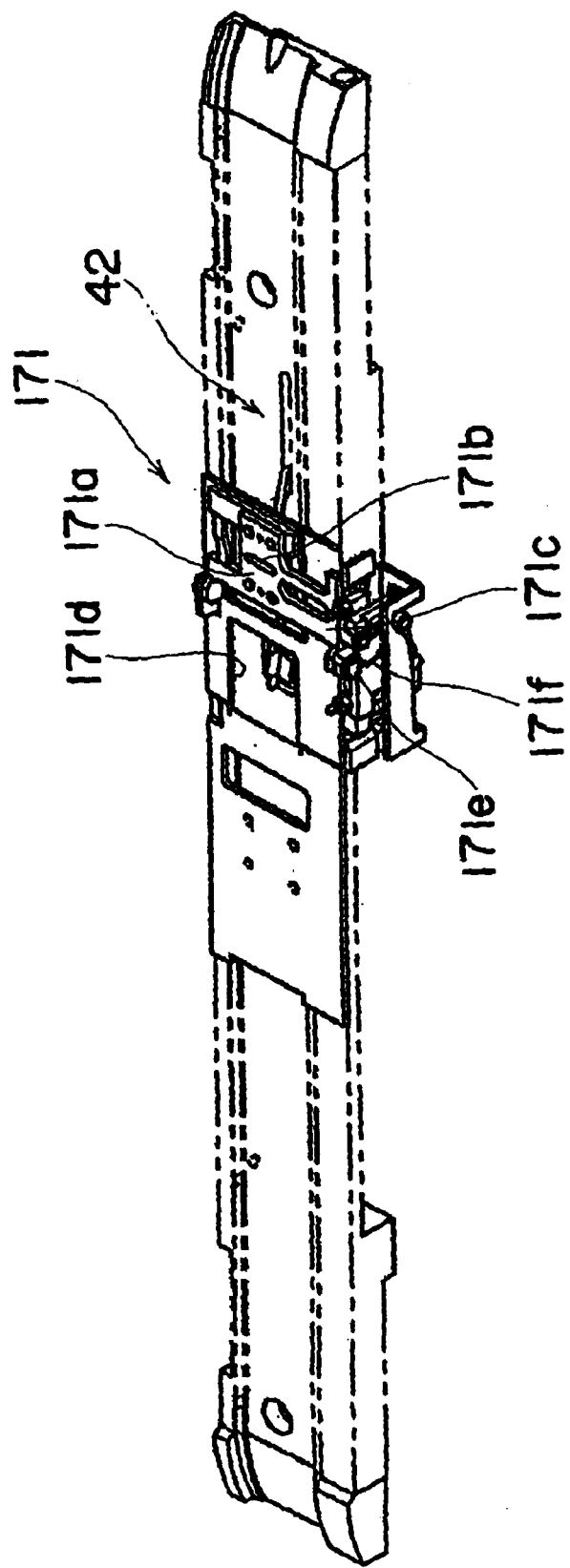
FIG. 21 is an enlarged perspective view showing a front-back inverting device in the apparatus for handling arrayed component in the third embodiment.
Figure 22:
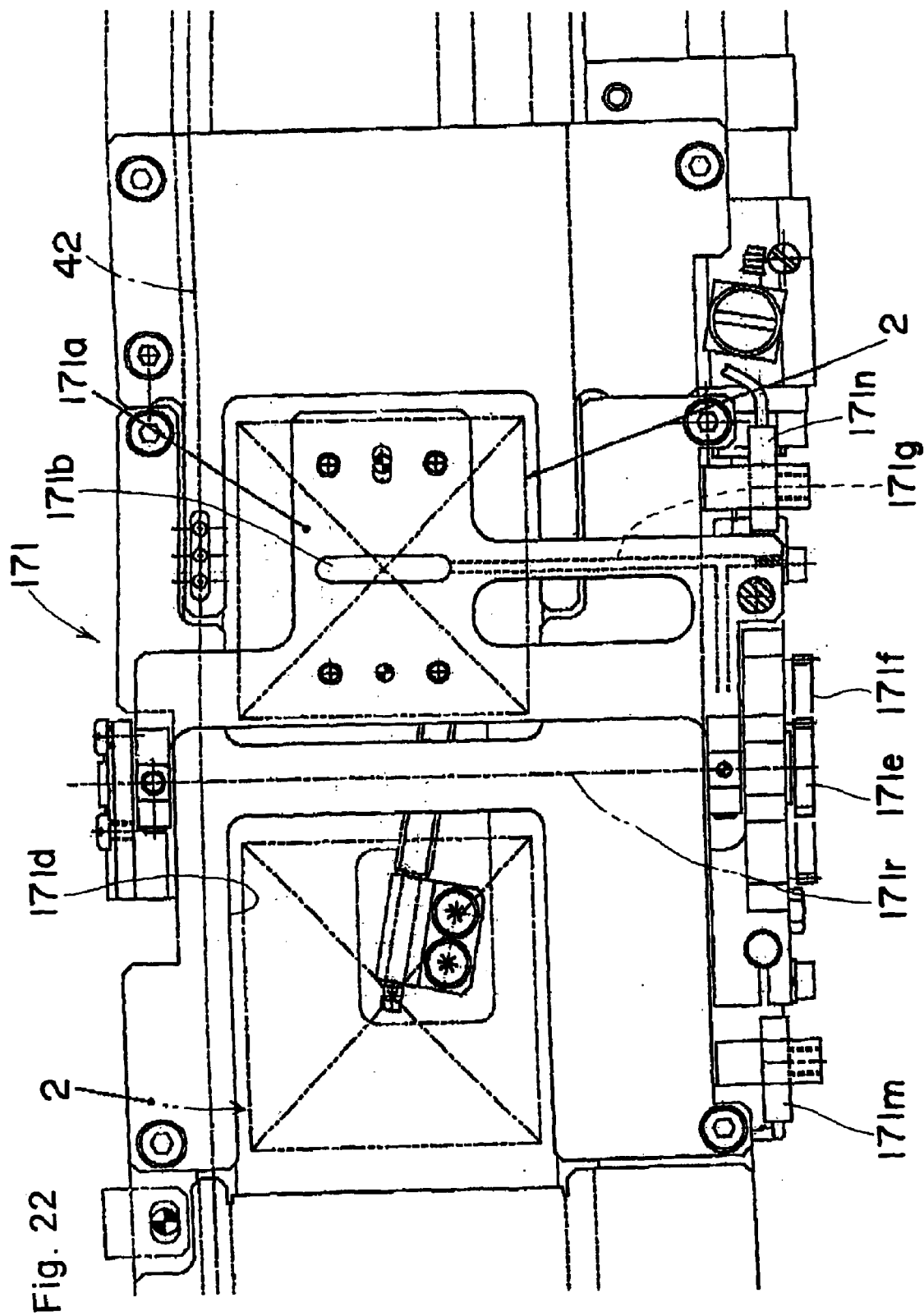
FIG. 22 is an enlarged plan view showing the front-back inverting device of FIG. 21.
Figure 23:
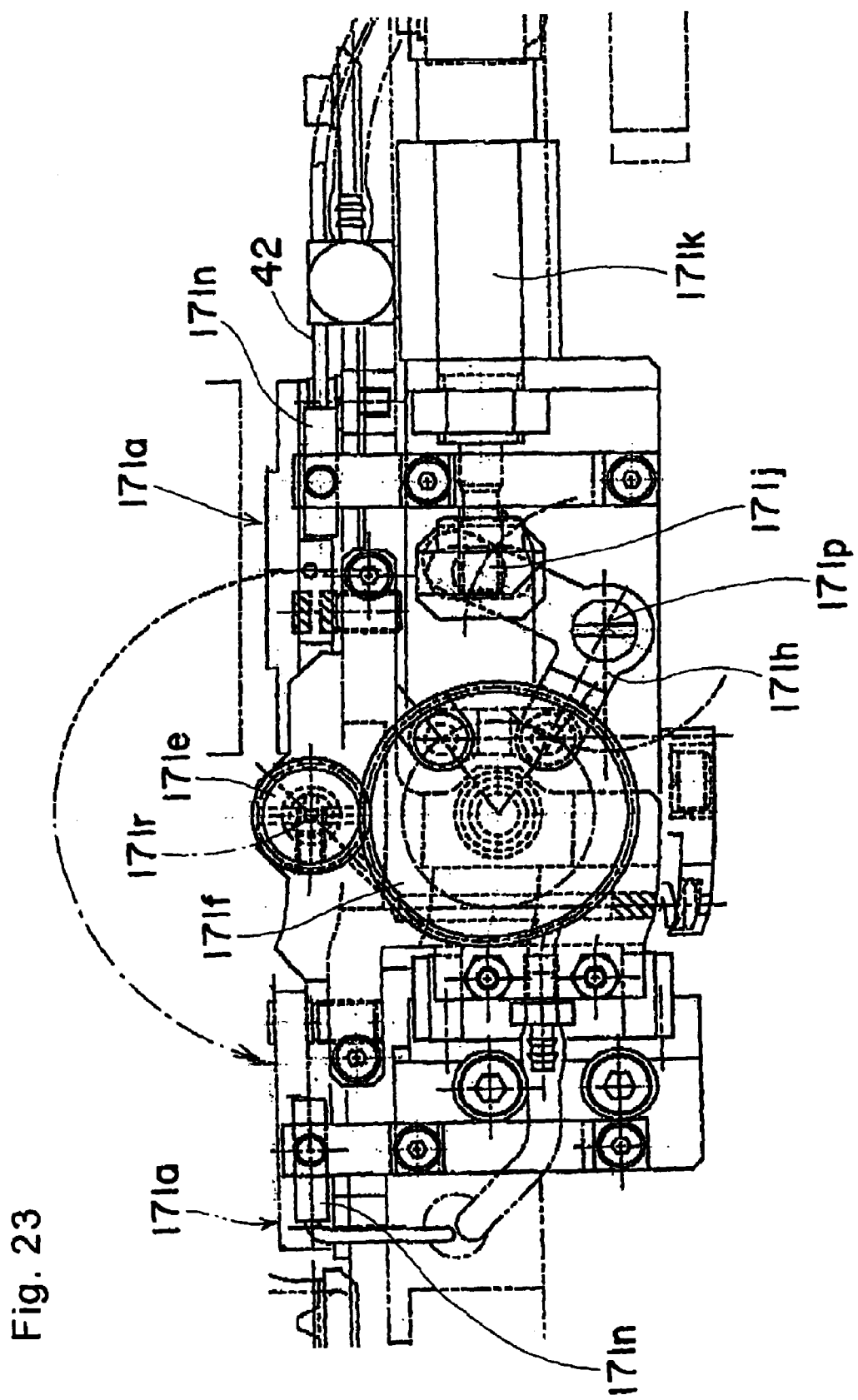
FIG. 23 is an enlarged side view showing the front-back inverting device of FIG. 21.

As shown in FIGS. 21 and 22, the front-back inverting device 171 is supported such that a front-back inverting device main body 171a can be inverted 180 degrees about a central axis 171r. At the center of the front-back inverting device main body 171a, there is formed a slot-type suction hole 171b, through which suction is made via a suction passage 171g so that the plane opposite to the active plane of the semiconductor element 2 held by the transfer head 133 is sucked and held by the front-back inverting device main body 171a. The front-back inverting device main body 171a is linked with a pinion 171e disposed on the lateral side of the front-back inverting device 171 so as to integrally rotate therewith. The pinion 171e is geared with a large gear 171f, which is liked to one end of a link 171h rotatable about a fulcrum 171p, while the other end of the link 171h is connected to an end 171j of a driving rod of an air cylinder 171k. Consequently, when driving of the air cylinder 171k moves the end 171j of the driving rod to the left side in FIG. 23, the link 171h rotates counterclockwise around the fulcrum 171p, thereby rotating the large gear 171f clockwise, which in turn rotates the pinion 171e counterclockwise, and so the front-back inverting device main body 171a is inverted 180 degrees from a solid line position on the right side of FIG. 23 to a chain line position on the left side thereof. Consequently, the front-back inverting device main body 171a faces the concave section 42a of the tape member 42 exposed to the inside of an opening 171d of the inverting device 171. For bringing the front-back inverting device main body 171a back to an original position, the air cylinder 171k is reverse-driven to move the end 171j of the driving rod to the right side in FIG. 23, which rotates the link 171h clockwise about the fulcrum 171p, thereby rotating the large gear 171f counterclockwise. This rotates the pinion 171e clockwise, and inverts the front-back inverting device main body 171a 180 degrees from a chain line position on the left side of FIG. 23 to a solid line position on the right side thereof. In inverting operation, when a proximity sensor 171m detects that the front-back inverting device main body 171a is positioned at an inverting position, sucking operation of the front-back inverting device main body 171a is terminated so that the front-back inverting device main body 171a stops suction and holding of the semiconductor element 2, by which the semiconductor element 2 is housed in the concave section with the active plane facing down. It is noted that another proximity sensor 171n detects that the front-back inverting device main body 171a is returned to an original position and ready for transferring next semiconductor element 2.

Hereinbelow, a method for using the front-back inverting device 171 structured as above will be specifically described. When a semiconductor element 2 is transferred to the tape member 42 with the active plane facing up, the transfer head 133 is moved to an area on the tape member 42 without the front-back inverting device 171 disposed. In this case, the semiconductor element 2 can be housed directly in the tape member 42 at the position without the presence of the front-back inverting device 171. When a semiconductor element 2 is transferred to the tape member 42 with the active plane facing down, the position of the transfer head 133 in the Y direction is set to be a position in the Y direction where the front-back inverting device 171 is provided. Under this condition, if the transfer head 133 that sucked the semiconductor element 2 at the pickup position C is moved in the X direction, the suction nozzle 3 is positioned on the upper side of the front-back inverting device main body 171a of the front-back inverting device 171. By descending the suction nozzle 3, the semiconductor element 2 is transferred to the front-back inverting device main body 171a on the front-back inverting device 171, and sucked through the suction hole 171b via the suction passage 171g, so that the semiconductor element 2 is sucked and held by the front-back inverting device main body 171a. Next, after sucking and holding by the suction nozzle 3 is stopped, the semiconductor element 2 is ascended and moved from the upper side of the front-back inverting device main body 171a to another position. Then, the air cylinder 171k is driven for inverting operation. Via the link 171h, the large gear 171f, and the pinion 171e, the front-back inverting device main body 171a of the front-back inverting device 171 rotates 180 degrees around the central axis 171r from a rotation shaft supported by a tape supporting rail 76. Consequently, the front-back inverting device main body 171a is inverted 180 degrees from the a solid line position on the right side of FIG. 23 to a chain line position on the left side thereof, and the active plane of the semiconductor element 2 sucked and held by the front-back inverting device main body 171a faces the concave section 42a of the tape member 42 exposed to the inside of the opening 171d of the inverting device 171. In this point, if the proximity sensor 171m detects that the front-back inverting device main body 171a is positioned at the inverting position, sucking operation of the front-back inverting device main body 171a is terminated so that the front-back inverting device main body 171a stops suction and holding in the front-back inverting device main body 171a, by which the semiconductor element 2 that has been sucked and held is housed in the concave section 42a of the tape member 42 with the active plane facing down. Thus, the semiconductor element 2 is front-back inverted and housed in the tape member 42.

For using the front-back inverting device 171 with the taping unit 70 movable in the Y direction, the front-back inverting device 171 may be positioned on an extension line of the pickup position C in the X direction. When the front-back inverting device 171 is not in use, the concave section 42a of the tape member 42 may be positioned on an extension line of the pickup position C in the X direction.

Figure 12:
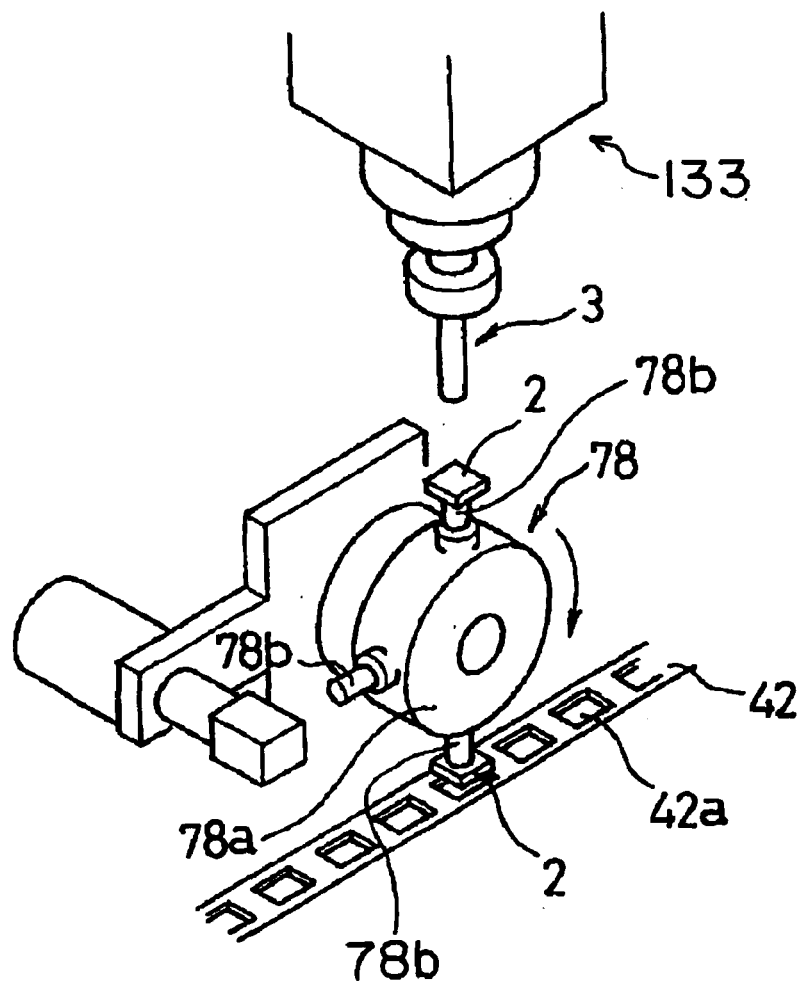
FIG. 12 is a schematic view showing a front-back inverting device in another embodiment.

Further, unlike the structure shown in FIGS. 10 and 11, the front-back inverting device 171 may be structured like a front-back inverting device 78 shown in FIG. 12, in which a plurality of sucking sections 78b are disposed around a cylindrical section 78a that rotates intermittently and the sucking sections 78b are put on each tape member 42. The suction nozzle 3 transfers the semiconductor element 2 to the sucking section 78b positioned on the upper side of the cylindrical section 78a. When the sucking section 78b that sucked the semiconductor element 2 is positioned on top of the tape member 42 by is rotation of the cylindrical section 78a, the semiconductor element 2 is detached and housed in the concave section 42a of the tape member 42.

Figure 13:
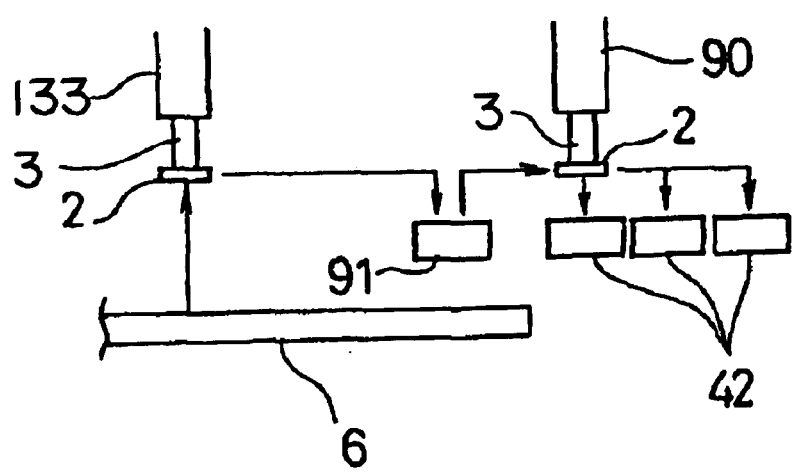
FIG. 13 is a schematic view showing transfer operation to a plurality of tapes in another embodiment.

To improve the efficiency of transferring the semiconductor element 2 to each tape member 42 with use of the transfer head 133, a second transfer head 90 exemplifying a second component transfer device may be disposed as shown in FIG. 13. More particularly, the transfer head 133 transfers semiconductor elements 2 to top of a relay stand 91 disposed on the upper side of the supporting body 6, and the second transfer head 90 separately transfers the semiconductor elements 2 on the relay stand 91 to each tape member 42. In this structure, since a moving distance of the transfer head 133 is a constant short distance, and separate transfer to each tape member 42 is performed by the second transfer head 90, transfer tact may be improved, and larger the number of separate transfers and number of taping units 70 become, more efficient separate transfer may be performed.

Figure 14:
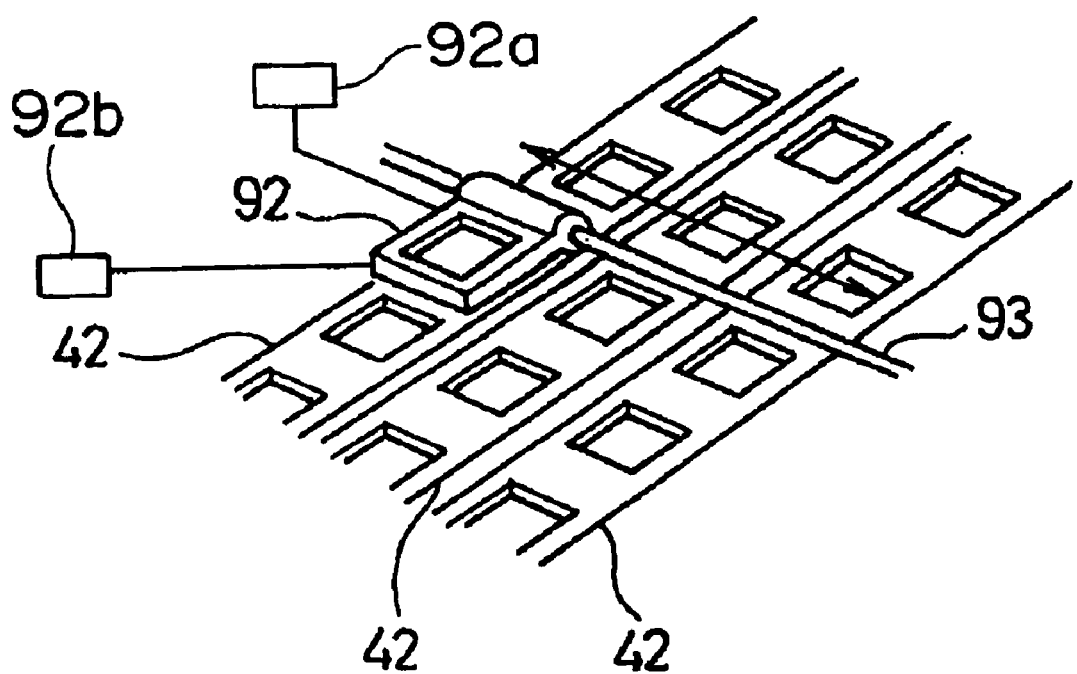
FIG. 14 is a perspective view showing the structure of separate transfer to a plurality of tapes with use of a front-back inverting device.

As shown in FIG. 14, a front-back inverting device 92 can be structured to function as the relay stand 91 and the second transfer head 90. Such front-back inverting device 92 is structured such that a main body thereof can reciprocate on a rod 93 running across each tape member 42 by driving of a drive device 92a provided with rod moving motor, air cylinder, and the like, as well as rotation motor, air cylinder, and the like. When the main body receives a semiconductor element 2 from the transfer head 133, and the semiconductor element 2 is sucked and held by the main body by driving of the suction device 92b, the main body is moved on the rod 93 to top of a tape member 42 corresponding to the quality rank of the semiconductor element 2 by driving of the drive device 92a. By driving of the drive device 92a, the main body is inverted with the rod 93 as a rotation shaft, and the semiconductor element 2 sucked and held by the main body is housed in the tape member 42. This structure is effective for inverting the semiconductor element 2 and then housing it in the tape member 42. Larger the number of separating operations and taping units 70 become, more efficient separate transfer may be performed.

Figure 15:
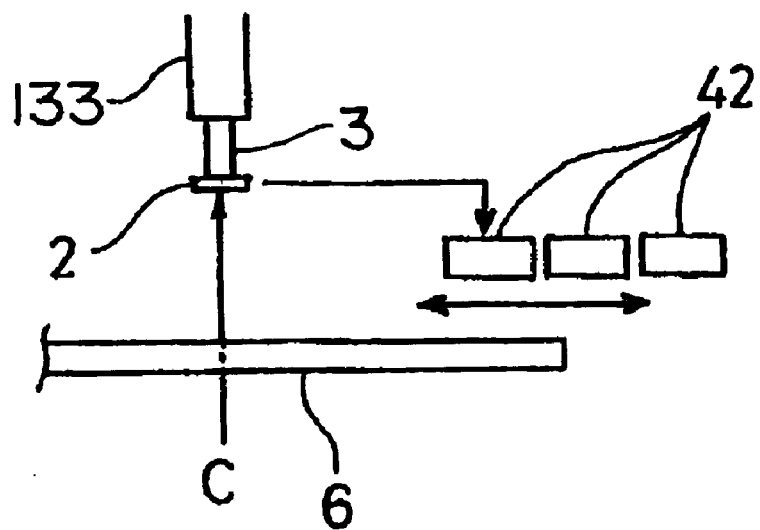
FIG. 15 is a schematic view showing the structure enabling a plurality of tapes to be moved.

Also, enabling each taping unit 70 to move in the X direction may decrease a moving distance of the transfer head 133 and improve transfer tact. More specifically, as shown in FIG. 15, the taping unit 70 is moved in the X direction such that a tape member 42 corresponding to the quality rank of a semiconductor element 2 picked up by the transfer head 133 is positioned at a specified position, and the semiconductor element 2 is transferred to the corresponding tape member 42 from the transfer head 133 moved to the specified position.

In handling a large-size semiconductor wafer 1, it is effective to position the tape member 42 on the upper side of the component receiving section 7. In addition to this, decreasing a moving distance of each semiconductor element 2 from the pickup position C to the tape member 42 can implement further increase of transfer efficiency.

As described before, the component receiving section 7 is structure to be rotatable by the receiving section rotating device 9. Consequently, as shown in FIG. 1 of the first embodiment, each unit region D1, D2, D3, D4 set by dividing a component supporting region of the supporting body 6 about an approximately central position of the supporting body 6, or, for example, about the pickup position C, into a plurality of regions is switched to be positioned at a pickup standby position E shown as a slanted area in FIG. 1 of the first embodiment by rotation of the supporting body 6 about approximately the central position thereof, and after each unit region D1, D2, . . . is positioned at the pickup standby position E, the component receiving section 7 is moved by the two-direction moving device 10 so that the positioned unit region D1, D2, . . . , are moved in the X and Y direction. If only the unit regions D1, D2, . . . moved to the pickup standby position E are moved in two directions by this rotative movement, for moving the semiconductor element 2 to the pickup position C in sequence, a moving distance of the component receiving section 7 in the X and Y direction is shortened. Consequently, together with the effect of disposing the taping unit 70 on the upper side of the component receiving section 7, necessary time for transfer is further shortened, thereby enabling increase of production efficiency due to decreased transfer tact.

Also, as shown in FIG. 10 and FIG. 2 of the first embodiment, the transfer device of arrayed components according to the third embodiment is equipped with an identifying device 36 including a recognizing camera 36a that images the semiconductor element 2 at the pickup position C and performs image recognition, as well as a reference position switching device 37 that switches reference of position recognition by the identifying device 36 after the unit region positioned at the pickup standby position E is switched with rotation of the supporting body 6 by the receiving section rotating device 9.

Normally, semiconductor elements 2 on the supporting body 6 are arrayed in the same direction if they are of the same types, and have common position reference for recognizing direction and position when being picked up and transferred to the tape member 42. Examples of the position reference include two points A and B locating on the diagonal line of a semiconductor element 2 as shown in FIG. 13. Regardless of whether the semiconductor element 2 has the shape of a square or a rectangle, the position reference is used to identify direction and position around the center G.

For simplifying the explanatory, the case of the semiconductor element 2 with the shape of a rectangle is shown in the drawings. Shown are semiconductor elements 2D1 to 2D4 that come to almost the same position at the pickup standby position E in each unit region D1 to D4 shown in FIG. 1 of the first embodiment. It is indicated that the direction of these semiconductor elements when they reach the pickup standby position E and the position of the position reference points A and B are each different as shown in FIGS. 6A to 6D of the first embodiment. The difference is determined by a rotation angle of the supporting body 6, so that depending on which of the unit regions D1 to D4 is located at the pickup standby position E, the rotation angle of the semiconductor element 2 at the position from the position reference points A and B is known.

By utilizing this structure, after the reference position switching device 37 receives a position switching signal informing that each of the unit regions D1 to D4 is switched to be positioned at the pickup standby position E by rotation around approximately the central position of the supporting body 6, the reference position switching device 37 switches reference of position recognition of the identifying device 36 to copy with gradual displacement of the direction of the semiconductor elements 2 of each unit region positioned at the pickup standby position E, i.e., gradual displacement of the direction of the position reference points A and B, by a specified angle around the center of the semiconductor element 2, in response to a rotation amount of the supporting body 6, thereby making it possible to prevent failure of recognizing the direction or position of the semiconductor element 2 as well as decrease of recognition accuracy.

Also, in the third embodiment, there is provided a tool rotating device 141 (the tool rotating device similar to the tool rotating device 41 shown in FIG. 5 of the first embodiment) for rotating a suction nozzle 3 about the center of a semiconductor element 2 to be picked up thereby. Upon reception of a position switching signal informing that each unit region positioned at the pickup standby position E is switched with rotation of the supporting body 6, the control unit 48 corrects the direction of the semiconductor element 2 picked up by the suction nozzle 3 based on known data on the direction and position by rotating the suction nozzle 3 with use of the tool rotating device 141 under the control of the control unit 48. Therefore, if the direction of a semiconductor element 2 in each of the unit regions D1 to D4 positioned at the pickup standby position E is displaced by a specified angle in response to a rotating amount of the supporting body 6, the semiconductor element 2 can be aligned in a specified direction and transferred to a transfer target position F, thereby enabling transfer of the semiconductor element 2 in a specified direction.

In addition to increase of transfer efficiency, the above described structure enables decrease of plane space for the transfer device, decrease of installation space for the transfer device installed in a clean room, as well as control of increase in running costs of the clean room.

Further, the above structure enables taping packaging of the semiconductor element 2, that has never been implemented before. This makes it possible to select various feeding styles of the semiconductor element 2 when mounting the semiconductor element 2 on a circuit board. In addition to the taping packaging, disposing a part tray in the same position realizes a tray pack of the semiconductor element 2, which is also applicable to a gel pack.

Also, in the transfer device of arrayed components in the third embodiment as shown in FIGS. 9A and 9B, feeding of the wafer housing cassette 50 is set on the back side of the device. In the case of a semiconductor wafer 1 having a diameter of, for example, 300 mm, if about 10 semiconductor wafers 1 are housed in the wafer housing cassette 50 in the shape of the supporting bodies 6, the total weight thereof is about 20 kg, making it difficult for an operator to carry the cassette and set it in the device. It is preferable that such replacement operation is automated. Accordingly, setting feeding of the wafer housing cassette 50 on the back side makes it possible to provide traveling space for a transport robot and the like on the back side, thereby enabling automatic replacement of the wafer housing cassette 50. The operation flow line can be simplified by limiting it to the front side, thereby enabling an operator to specialize in such operation as operational setting of the device and replacement of the taping unit 70.

In view of the forgoing, according to the present invention, taping packaging of semiconductor elements is fulfilled, and transfer thereof by selecting the active plane facing up or down is enabled. Also, space for transfer may be decreased, and the apparatus, if applied to handling of a large-size semiconductor wafer, can be downsized, which enables suppression of installation space for the transfer device of arrayed component installed in a clean room, resulting in reduction of running costs.

More specifically, the method for handling arrayed components of the present invention is characterized by comprising moving each component supported on the supporting body in a state of being arrayed in the two orthogonal directions to a specified pickup position in sequence with a movement of the supporting body in the two component array directions at a specified position, and feeding the same to pickup operation by a component handling tool, wherein each unit region set by dividing a component supporting region of the supporting body about approximately a central position of the supporting body into a plurality of regions is positioned at a pickup standby position by rotation of the supporting body about approximately a central position thereof in a switching manner, and after each unit region is positioned at the pickup standby position, each component in the positioned unit region is moved to the pickup position in sequence with a movement of the supporting body in the two component array directions, and fed to pickup operation in sequence.

In such structure, the moving range of the arrayed components supported by the supporting body moving in the two orthogonal directions for feeding each arrayed component to pickup operation by the component handling tool is a size range in one unit region set by dividing the component supporting region of the supporting body around the pickup position into a plurality of regions seen in the two component array directions, which is smaller than the region in the case of setting the entire component supporting region as the moving region. For example, when unit regions are half regions set by dividing at an angle of 180 degrees, the maximum moving range in one component array direction along the direction of two unit regions being disposed side by side is reduced by half. When unit regions are quarter regions set by dividing at an angle of 90 degrees, the maximum moving range in two component array directions along the directions of one unit region being adjacent to unit regions on both sides thereof is also reduced by half. A plurality of unit regions dividedly set on the supporting body are switched to be positioned at the pickup standby position, where each arrayed component is fed to pickup operation with a movement of the supporting body, by rotation of the supporting body about an approximately central position of the supporting body in the component supporting region, so that each arrayed component is fed to pickup operation. Consequently, it is not necessary to move the supporting body beyond the above-stated moving range for feeding all the components in each unit region to pickup operation. Therefore, space can be saved commensurate with division of the component supporting region of the supporting body about approximately the central position of the supporting body, proving the effectiveness since considerable reduction of necessary space can be achieved with small division such as division at an angle of 90 degrees. In addition, the pickup position remains unchanged. For example, in division at an angle of 180 degrees and 90 degrees, a relation between the component array direction and the moving direction of the supporting body may be kept unchanged. Consequently, positioning for pickup operation of each component can be easily implemented by position switching through rotation without taking extra time.

In the case of feeding the component to pickup operation with push-up operation by the push-up pin involved, easy and secure pickup of the component may be achieved without being bothered by surrounding components or causing displacement of surrounding components.

In this case, the method for handling arrayed components, and more specifically the method for feeding arrayed components further comprises moving each component supported on the supporting body in a state of being arrayed in the two orthogonal directions to a specified pickup position in sequence with a movement of the supporting body at a specified position in the two component array directions, and feeding the same to pickup operation by the component handling tool with push-up operation by the push-up pin involved, wherein after each unit region set by dividing a component supporting region of the supporting body about approximately a central position of the supporting body into a plurality of regions is positioned at a pickup standby position by rotation of the supporting body about approximately a central position thereof in a switching manner and each unit region is positioned at the pickup standby position, each component in the positioned unit region is moved to the pickup position in sequence with a relative movement of the supporting body, the pickup position, and the push-up pin in the two component array directions, and fed to pickup operation in sequence. In such case, despite the use of the push-up pin, the same effect as the above method is implemented, and the relative movement of the supporting body, the pickup position and the push-up pin in the two component array directions, if executed in the direction of approximating to each other, decreases the moving distance and moving time of the components to the pickup position, thereby improving productivity.

Alternatively, the pickup position and the push-up pin are corresponded in sequence to, for example approximately a central position of each unit region set by dividing a component supporting region of the supporting body about approximately a central position of the supporting body into a plurality of regions, and after the pickup position and the push-up pin are corresponded to, for example, approximately the central position of each unit region, the component in the unit region corresponded to the pickup position and the push-up pin is moved in sequence to the pickup position with a relative movement of the pickup position, the push-up pin, and the supporting body in the two component array directions, and fed to pickup operation in sequence. This method also implements the same effect and further saves rotation of the supporting body.

The apparatus for handling arrayed components of the present invention, and more particularly the feeding device of arrayed components is provided only with: the component receiving section for receiving and holding the supporting body that supports components such as semiconductor elements arrayed in the two orthogonal directions; the receiving section rotating device for positioning in a switching manner each unit region set by dividing the component supporting region of the supporting body about approximately the central position of the supporting body into a plurality of regions at the pickup standby position around approximately the central position of the supporting body by rotating the component receiving section approximately the central position of the supporting body received in the component receiving section; and the two-direction moving device for moving the component receiving section in the two component array directions and positioning the components in the unit region positioned at the pickup standby position on the supporting body one by one at the pickup position for pickup operation by the component handling tool. Consequently, additional plane space is not necessary for providing the receiving section rotating device for rotating the receiving section, and all the components such as semiconductor elements on the supporting body received in the receiving section can be fed to pickup operation under conditions similar to conventional conditions without failing space saving in the above method, making it possible to advantageously handle a large-sized semiconductor wafer as one example of the component in terms of space saving.

The apparatus for handling arrayed components of the present invention, and more particularly the transfer device of arrayed components is provided with: the component receiving section for receiving and holding the supporting body that supports components such as semiconductor elements arrayed in the two orthogonal directions; the receiving section rotating device for positioning in a switching manner each unit region set by dividing the component supporting region of the supporting body about approximately the central position of the supporting body into a plurality of regions at the pickup standby position around approximately the central position of the supporting body by rotating the component receiving section about approximately the central position of the supporting body received in the component receiving section; the two-direction moving device for moving the component receiving section in the two component array directions and positioning the components in the unit region positioned at the pickup standby position on the supporting body one by one at the pickup position; and the component transfer device for picking up the component whenever it is moved to the pickup position with use of the component handling tool and transferring the same to other places.

In such structure, components such as semiconductor elements arrayed on the supporting body are fed one by one to the pickup position while the above-stated space saving is fulfilled, and the components are picked up by, for example, the component handling tool of the component transfer device similar to conventional one and transferred to a specified location so as to be fed to following handling.

In this case, the device may be further provided with: the identifying device for imaging the component at the pickup position and performing image recognition; and the reference position switching device for switching reference of position recognition by the identifying device each time a unit region at the pickup standby position is switched with rotation of the supporting body by the receiving section rotating device. If it is the case, normally, components on the supporting body are arrayed in the same direction if they are the same components, and have common position reference for recognizing direction and position in various handling after pickup operation such as processing, assembling, housing, and mounting. When each of the unit regions is switched to be positioned at the pickup standby position by rotation around the pickup position, the direction of the components such as semiconductor elements of each unit region positioned at the pickup standby position, i.e., the direction of the position reference, is displaced by a specified angle around the center of the component in response to a rotation amount of the supporting body. Such angle displacement may be compensated by switching reference of position recognition of the identifying device whenever a unit region positioned at the pickup standby position is switched, thereby making it possible to prevent failure of recognizing the direction or position as well as decrease of recognition accuracy.

Also, the device may be further provided with: the tool rotating device for rotating the component handling tool about the center of the component such as semiconductor elements to be picked up thereby; and the control unit for controlling the tool rotating device so as to correct a direction of the component picked up by the component handling tool through rotation of the component handling tool by the tool rotating device whenever a unit region at the pickup standby position is switched with rotation of the supporting body by the receiving section rotating device. In this case, if the direction of a component such as semiconductor elements in each of the unit regions positioned at the pickup standby position is displaced by a specified angle around the center of the component in response to a rotating amount of the supporting body as described above, the component can be transferred after the control unit controls the tool rotating device so as to rotate the component handling tool that picked up the component for correcting the displacement, thereby causing no inconvenience nor problems in handling the component such as semiconductor elements in a specified direction after transfer.

The apparatus for handling arrayed components of the present invention, and more particularly the housing device of arrayed components is characterized by being provided with: the component receiving section for receiving and holding the supporting body that supports components such as semiconductor elements arrayed in the two orthogonal directions; the receiving section rotating device for positioning in a switching manner each unit region set by dividing the component supporting region of the supporting body about approximately the central position of the supporting body into a plurality of regions at the pickup standby position around approximately the central position of the supporting body by rotating the component receiving section about approximately the central position of the supporting body received in the component receiving section; the two-direction moving device for moving the component receiving section in the two component array directions and positioning the components in the unit region positioned at the pickup standby position on the supporting body one by one at a pickup position; the component housing section for receiving the component in the component housing member for next-step handling so as to handle the component in a specified packing style; and the component transfer device for picking up a component with use of the component handling tool whenever the component is positioned at the pickup position and transferring the same to the component housing member in the component housing section.

In such structure, receiving the component such as semiconductor elements which is picked up and transferred to the component housing member provided in the component housing section makes it possible to accomplish housing and feeding of the component in a packing style suitable for next-step handling through selection of the component housing members in type such as tapes and pallets, by utilizing each necessary property in the above transfer operation.

In this case, the device may be further provided with the control unit for controlling operation of the component transfer device and the housing device so that the component housing section can provide the plurality of component housing members side by side and a plurality of the component housing members are separately used depending on a type of the component picked up by the component handling tool and recognized by the identifying device for transfer and housing operation. Accordingly, in the case where different components with different quality rank are present in components such as semiconductor elements on the supporting body, the components may be housed with separate use of different housing members per type, which makes it possible to achieve feeding of the components for respective application or handling by utilizing the recognition function of the identifying device. If one type of the component such as semiconductor elements is a defective product, the control unit executes control so as to dispose in a disposal section the component which is determined as the defective product by the control unit based on the recognition result of the identifying device, which makes it possible to achieve easy processing of defective products in the transfer cycle, thereby saving a special operational step.

The apparatus for handling arrayed components of the present invention, and more specifically the transfer method of arrayed components is characterized by comprising: feeding the supporting body that supports a plurality of components in a state of being arrayed in the two orthogonal directions to a specified position; moving each component in sequence to the specified pickup position with a movement of the supporting body at the specified position in the two component array directions; picking up the component moved to the pickup position with use of the component handling tool; and transferring the picked-up component to a transfer position set to be laid on top of the supporting body with use of the component handling tool.

According to the transfer method, with a movement of the supporting body in the component array directions, the picked-up component is transferred to the transfer position set to be laid on top of the supporting body with use of the component handling tool, which makes it possible to decrease a moving distance of the component handling tool.

Larger supporting region of the components on the supporting body increases the moving range of the supporting body. If the transfer position is on the same plane, the maximum necessary moving distance of the supporting body exceeds a diameter of the supporting body. However, providing the transfer position on the upper side of a moving direction of the supporting body shortens the transfer distance, thereby implementing efficient transfer operation with shortened transfer time.

In the transfer method, each unit region set by dividing the component supporting region of the supporting body about approximately a central position of the supporting body into a plurality of regions is positioned at a pickup standby position by rotation of the supporting body about approximately a central position thereof in a switching manner, and whenever each unit region is positioned at the pickup standby position, each component in the positioned unit region is moved to a specified pickup position in sequence with a movement of the supporting body in the two component array directions. Consequently, if the supporting body has a large diameter, more efficient transfer operation is implemented. More particularly, divided unit regions are transferred to a specified region by rotation and each unit region transferred to the specified region is moved in two component array directions. As a result, with transfer from the pickup standby position, even a large supporting body can move each component to the pickup position with a smaller moving distance. In addition to providing the transfer position on the upper side of the moving direction of the supporting body, the transfer distance is further shortened, thereby implementing efficient transfer operation with shortened transfer time.

Further, the component picked up with use of the component handling tool may be transferred with front side and back side of the component inverted, thereby enabling transfer operation suitable for the handling state of the component after transfer.

Further, the apparatus for handling arrayed components of the present invention, and more particularly the transfer device of arrayed components is characterized by being provided with: the component receiving section for receiving and holding the supporting body that supports a plurality of components in a state of being arrayed in the two orthogonal directions; the two-direction moving device that moves the component receiving section in the two component array directions for moving the components to the pickup position one by one in sequence; the component housing section disposed at a position to be laid on top of the component receiving section; and the component transfer device for picking up the component and transferring the same to the component housing section whenever the component is moved to the pickup position.

According to the structure, the component housing section is disposed at the position to be laid on top of the component receiving section, which makes it possible to shorten a moving distance of the component transfer device from the component receiving section to the component housing section. More particularly, larger supporting region of the components on the supporting body increases the moving range of the component receiving section. If the component housing position is on the same plane, the maximum necessary moving distance of the supporting body exceeds a diameter of the supporting body. However, providing the component housing section on the upper side of a moving direction of the component receiving section shortens the transfer distance of the component transfer device, thereby implementing efficient transfer operation with shortened transfer time.

Further, the apparatus for handling arrayed components of the present invention, and more particularly the transfer device of arrayed component is characterized by being provided with: the component receiving section for receiving and holding the supporting body that supports a plurality of components in a state of being arrayed in the two orthogonal directions; the two-direction moving device that moves the component receiving section in the two component array directions for moving the components to the pickup position one by one in sequence; the component housing sections disposed in a plurality of rows at a position to be laid on top of the component receiving section; and the component transfer device for picking up the component and transferring the same to the respective component housing section whenever the component is moved to the pickup position.

In this structure, the component housing sections are disposed in a plurality of rows, so that the respective components are separately transferred by division such as quality rank to the corresponding component housing section.

In the above-described structure of the present invention, there may be provided the receiving section rotating device for positioning each unit region set by dividing a component supporting region of the supporting body about an approximately central position of the supporting body into a plurality of regions at a pickup standby position about an approximately central position of the supporting body in a switching manner. Consequently, if the supporting body has a large diameter, more efficient transfer operation can be implemented. More particularly, divided unit regions are transferred to a specified region by rotation and each unit region transferred to the specified region is moved in the two component array directions. As a result, with transfer from the pickup standby position, even a large supporting body can move each component to the pickup position with a smaller moving distance. In addition to providing the component housing section on the upper side of the component receiving section, the transfer distance is further shortened, thereby implementing efficient transfer operation with shortened transfer time.

Further, there may be disposed a front-back inverting device between the component transfer device and the component housing section, for selectively performing operation of receiving the component from the component transfer device, inverting front side and back side of the component, and housing the component in the component housing section. This makes it possible to select front side and back side of the component to be transferred to the component housing section, thereby enabling housing of the component in a direction suitable for the state of using the component housed in the component housing section.

Further in the structure of the present invention, there may be provided a second component transfer device for receiving the component from the transfer device and separately transferring the component to the component housing sections provided in a plurality of rows. This makes it possible to increase transfer efficiency for separately transferring each component to a plurality of the component housing sections.

Further, there may be provided a front-back inverting device for receiving the component from the component transfer device, moving to the component housing section provided in a plurality of rows, and separately transferring the component with front side and back side thereof inverted to each component housing section, which makes it possible to improve efficiency of the transfer operation with front-back inverting operation involved.

Furthermore, each component housing section disposed in a plurality of the rows may be moved to a specified position on the component receiving section, and the component may be transferred to the component housing section moved to the specified position by the component transfer device. This makes it possible to improve transfer efficiency for separately transferring the component to each component housing section.

Further, distribution of each component to a plurality of the component housing sections may be implemented by transferring each component of respective division to a plurality of the component housing sections disposed by division of each component based on data identifying respective division of each component arrayed on the supporting body.

The apparatus for handling arrayed components of the present invention, and more specifically the transfer device of the arrayed components is characterized by being provided with: the component feeding section for housing the supporting body that supports a plurality of semiconductor elements separated from a semiconductor wafer by dicing in a state of being arrayed in the two orthogonal directions and feeding the same to a feeding position; the component receiving section for receiving and holding the supporting body extracted from the component feeding section; the moving device for moving the component receiving section in the two component array directions for moving the semiconductor elements one by one in sequence to a pickup position; the taping packaging section for housing the semiconductor elements in array in an extending direction of a tape and performing taping packaging; the component transfer device for picking up the semiconductor element and transferring the same in sequence to the taping packaging section whenever the semiconductor element is moved to the pickup position; and the front-back inverting device disposed between the transfer device and the taping packaging section, for selectively performing operation of receiving the component from the transfer device, inverting front side and back side of the component, and housing the component in the component housing section.

According to the structure, the semiconductor element picked up by the transfer device from the component receiving section is transferred to the taping packaging section for taping packaging, which makes it possible to deliver the semiconductor element in a taping package style preferable for mounting on a circuit board. In mounting a semiconductor element on a circuit board, there are demands for mounting the semiconductor element with an active plane thereof facing up and mounting the semiconductor element with an active plane thereof facing down. In order to fulfill the demands, the front-back inverting device is selectively operated so as to freely set the front-back direction of the semiconductor element housed in the component housing section.

In the above structure, providing the taping packaging section at the position to be laid on top of the component receiving section makes it possible to decrease a moving distance by the transfer device, thereby implementing efficient transfer operation even in handling of a large-sized semiconductor wafer. Further, there may be provided the receiving section rotating device for positioning each unit region set by dividing the component receiving section about an approximately central position of the supporting body into a plurality of regions at a pickup standby position about an approximately central position of the supporting body in a switching manner. This enables promotion of more efficient handling of a large-sized semiconductor wafer.

Also, based on data identifying each semiconductor element disposed in array on the semiconductor wafer by quality rank, each semiconductor element of respective quality rank may be transferred to a plurality of taping packaging sections disposed by quality rank, thereby implementing separate transfer of each semiconductor element by types such as quality rank to respective taping packaging section.

The above-described each characteristic of the present invention may be used independently or in various combinations.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for handling arrayed components that feeds the arrayed components arrayed in two component array directions, comprising: moving each component supported on a supporting body in a state of being arrayed in two orthogonal directions to a pickup position in sequence with a movement of the supporting body in the two component array directions, and making the components subjected to pickup operation by a component handling tool, wherein each unit region set by dividing a component supporting region of the supporting body about an approximately central position of the supporting body into a plurality of regions is positioned at a pickup standby position by rotation of the supporting body about the approximately central position of the supporting body in a switching manner; and after each unit region is positioned at the pickup standby position, positioning each component in the positioned unit region to the pickup position in sequence with a movement of the supporting body in the two component array directions, and subjected to pickup operation in sequence.

2. A method for handling arrayed components that feeds the arrayed components arrayed in two component array directions as defined in claim 1, wherein the component is subjected to the pickup operation by the component handling tool with pushup operation by a push-up pin involved, and after each unit region is positioned at the pickup standby position, the component in the positioned unit region is moved to the pickup position in sequence with a relative movement of the supporting body, the pickup position, and the push-up pin in the two component array directions, and subjected to the pickup operation in sequence to feed the arrayed components arrayed in the two component array directions.

3. A method for handling arrayed components that feeds the arrayed components arrayed in two component array directions as defined in claim 1, wherein the component is subjected to the pickup operation by the component handling tool with push-up operation by a push-up pin involved, and when the component is subjected to the pick-up operation, further comprising corresponding each unit region set by dividing a component supporting region of the supporting body about an approximately central position of the supporting body into a plurality of regions to the pickup position and the push-up pin, and after the pickup position and the push-up pin are corresponded to each unit region, moving components in the unit region corresponding to the pickup position and the push-up pin in sequence to the pickup position with a relative movement of the pickup position and the push-up pin, and the supporting body in the two component array directions, and making the components subjected to pickup operation in sequence to feed the arrayed components arrayed in the two component array directions.

4. A method for handling arrayed components as defined in claim 1, wherein the unit region is a quarter region divided by an angle of 90 degrees.

5. A method for handling arrayed components as defined in claim 1 that transfers the arrayed components arrayed in the two component array direction, comprising:

picking up the component moved to the pickup position with use of the component handling tool; and transferring the picked-up component to a component transfer target position set to be laid over a top of the supporting body with use of the component handling tool.

6. A method for handling arrayed components as defined in claim 1, wherein the component picked up with use of the component handling tool is transferred with front side and back side of the component inverted.

7. A method for handling arrayed components as defined in claim 2, wherein the unit region is a quarter region divided by an angle of 90 degrees.

8. A method for handling arrayed components as defined in claim 3, wherein the unit region is a quarter region divided by an angle of 90 degrees.

* * * * *

UNITED STATES PATENT AND TRADEMARK OFFICE
CERTIFICATE OF CORRECTION

PATENT NO. : 6,830,989 B1
DATED : December 14, 2004
INVENTOR(S) : Satoshi Shida et al.

It is certified that error appears in the above-identified patent and that said Letters Patent is hereby corrected as shown below:

<u>Column 36,</u>
Line 45, replace "pushup" with -- push-up --.

Signed and Sealed this

Seventeenth Day of May, 2005

JON W. DUDAS
*Director of the United States Patent and Trademark Office*